US012613208B2

(12) United States Patent (10) Patent No.: US 12,613,208 B2
Majima et al. (45) Date of Patent: Apr. 28, 2026

(54) GAS SENSOR

(71) Applicant: JAPAN SCIENCE AND TECHNOLOGY AGENCY, Kawaguchi (JP)

(72) Inventors: Yutaka Majima, Tokyo (JP); Trong Tue Phan, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 282 days.

(21) Appl. No.: 18/547,505

(22) PCT Filed: Feb. 15, 2022

(86) PCT No.: PCT/JP2022/005989
§ 371 (c)(1),
(2) Date: Aug. 23, 2023

(87) PCT Pub. No.: WO2022/181400
PCT Pub. Date: Sep. 1, 2022

(65) Prior Publication Data
US 2024/0133832 A1 Apr. 25, 2024
US 2024/0230566 A9 Jul. 11, 2024

(30) Foreign Application Priority Data

Feb. 25, 2021 (JP) ................................. 2021-029146

(51) Int. Cl.
*G01N 27/04* (2006.01)
*H10D 62/10* (2025.01)

(52) U.S. Cl.
CPC ........... *G01N 27/04* (2013.01); *H10D 62/121* (2025.01)

(58) Field of Classification Search
CPC .............................. G01N 27/04; H10D 62/121
See application file for complete search history.

(56) References Cited

U.S. PATENT DOCUMENTS 8,281,642 B2 * 10/2012 Lee ...................... G01N 27/127
73/23.31
2004/0261500 A1 * 12/2004 Ng ......................... B82Y 15/00
73/31.05
2015/0241386 A1 8/2015 Kim et al.

FOREIGN PATENT DOCUMENTS

CN 110702743 A * 1/2020 ........... C23C 14/165
CN 111398362 A 7/2020
(Continued)

OTHER PUBLICATIONS

Alexander Nerowski et al., Bottom-up synthesis of ultrathin straight platinum nanowires: Electric field impact, Nano Research, 2013, pp. 303-311, vol. 6, No. 5.

(Continued)

*Primary Examiner* — Jamel E Williams
(74) *Attorney, Agent, or Firm* — KENJA IP LAW PC

(57) ABSTRACT

To provide a gas sensor with fast response and high sensitivity to oxygen gas. Disclosed is a gas sensor 100 including: a substrate 10; a first pad electrode 12A and a second pad electrode 12B; a nanowire 14 made of a specific metal; and an oxide layer 16 made of a high-resistance semiconductor that is an oxide of a metal different from a metal constituting the nanowire 14. The first pad electrode 12A and the second pad electrode 12B are formed on or above the substrate 10. The nanowire 14 connects the first pad electrode 12A and the second pad electrode 12B and is formed on or above the substrate 10.

The oxide layer 16 is formed in contact with the nanowire 14. This contact between the nanowire 14 and the oxide layer 16 provides fast response and high sensitivity to oxygen gas.

10 Claims, 17 Drawing Sheets

(56) References Cited

FOREIGN PATENT DOCUMENTS

| JP | 2003149189 | A | | 5/2003 | |
|----|------------|---|---|--------|---|
| JP | 2004515782 | A | | 5/2004 | |
| JP | 2005283578 | A | | 10/2005 | |
| JP | 2006526155 | A | * | 11/2006 | .......... G01N 33/005 |
| JP | 2015137998 | A | | 7/2015 | |
| JP | 2020056643 | A | | 4/2020 | |
| KR | 1020120100536 | A | | 9/2012 | |
| KR | 20130109717 | A | * | 10/2013 | .............. C23C 4/11 |
| KR | 1020130109717 | A | | 10/2013 | |
| KR | 101424867 | B1 | * | 8/2014 | .......... G01N 27/127 |

OTHER PUBLICATIONS

Fan Yang et al., The Surface Scattering-Based Detection of Hydrogen in Air Using a Platinum Nanowire, Nano Letters, 2012, pp. 2924-2930, vol. 12.

May 17, 2022, International Search Report issued in the International Patent Application No. PCT/JP2022/005989.

Mengning Ding et al., Highly Sensitive Chemical Detection with Tunable Sensitivity and Selectivity from Ultrathin Platinum Nanowires, small, 2017, pp. 1-7, vol. 13, No. 1602969.

Aug. 29, 2023, International Preliminary Report on Patentability issued in the International Patent Application No. PCT/JP2022/005989.

Nov. 19, 2024, the Extended European Search Report issued by the European Patent Office in the corresponding European Patent Application No. 22759439.7.

Jul. 22, 2025, Communication pursuant to Article 94(3) EPC issued by the European Patent Office in the corresponding European Patent Application No. 22759439.7.

Dec. 22, 2025, Office Action issued by the China National Intellectual Property Administration in the corresponding Chinese Patent Application No. 202280016409.5.

* cited by examiner

Various Width: W          Various Length: L          *FIG. 3*
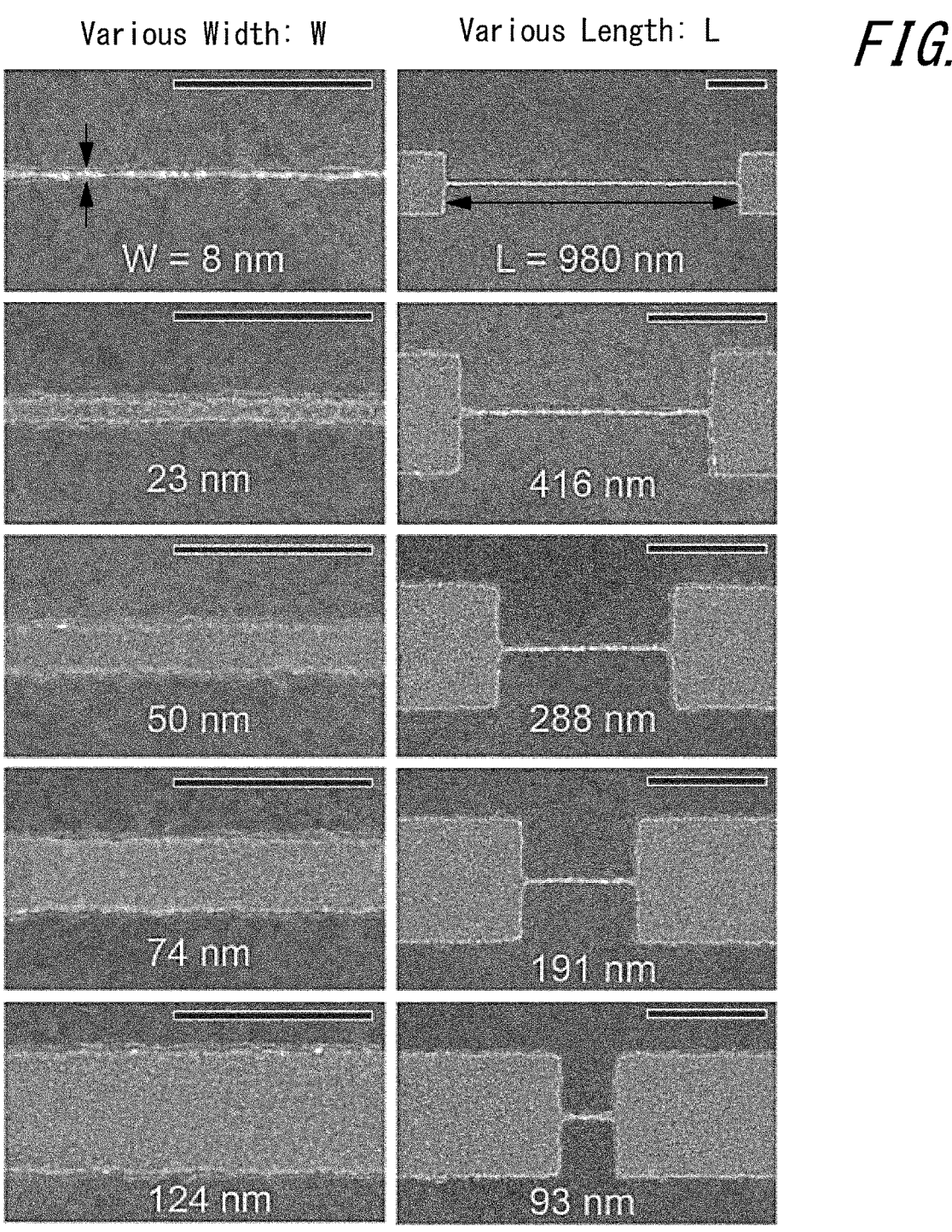
(Scale bar:200nm)

GAS SENSOR

TECHNICAL FIELD

This disclosure relates to a gas sensor that combines a nanowire made of a specific metal with an oxide made of a high-resistance semiconductor.

BACKGROUND

Various types of gas sensors are currently used in electrical appliances, vehicles, ships, aircraft, and other equipment that support our daily lives. For example, in order to improve the combustion efficiency of an engine and to ensure that exhaust gases meet environmental standards, the mixing ratio of air and fuel supplied to the engine needs to be controlled in automobiles, and in such a control system, for example, as described in JP 2015-137998 A (PTL 1), oxygen gas sensors with solid electrolytes (e.g. zirconia) are used. Also known as oxygen gas sensors are resistance-type oxygen gas sensors using oxide semiconductors, as described in JP 2003-149189 A (PTL 2).

F. Yang et al., "*The Surface Scattering-Based Detection of Hydrogen in Air Using a Platinum Nanowire,*" Nano Lett. 12 (2012), 2924-2930 (NPL 1) also describes a gas sensor in which first and second pad electrodes and a platinum nanowire connecting these pad electrodes are formed on a glass substrate. In this gas sensor, hydrogen gas is detected based on changes in resistance detected across the first and second pad electrodes while a constant voltage is applied across the first and second pad electrodes.

CITATION LIST

Patent Literature

PTL 1: JP 2015-137998 A
PTL 2: JP 2003-149189 A

Non-Patent Literature

NPL 1: F Yang et al., "*The Surface Scattering-Based Detection of Hydrogen in Air Using a Platinum Nanowire,*" Nano Lett. 12 (2012), 2924-2930

SUMMARY

(Technical Problem)

Oxygen gas sensors with solid electrolytes, such as those described in PTL 1, require a reference gas, and have problems in that they are not sufficiently sensitive to oxygen and thus their response is slow (response time is several tens of seconds). On the other hand, resistance-type oxygen gas sensors using oxide semiconductors, such as those described in PTL 2, have a response time of 10 seconds or less when the operating temperature is very high, such as 900° C. or 600° C. However, they have a response time of several hundred seconds or longer when the operating temperature is relatively low, around 300° C., and hence they are not yet meeting the needs of industry in terms of response speed.

The gas sensor using a platinum nanowire described in NPL 1 detects hydrogen gas and is not described to detect oxygen gas. In other words, there is no verification of any sensor characteristics such as response speed or sensitivity to oxygen gas.

It would thus be helpful to provide a gas sensor with fast response and high sensitivity to oxygen gas.

(Solution to Problem)

In order to solve the above issues, the present inventors conducted a diligent study and made the following findings. The present inventors conceived of a gas sensor that combines a nanowire made of a specific metal, such as platinum (Pt), with an oxide layer made of a specific high-resistance semiconductor. Arranging the nanowire in contact with the oxide layer made of a high-resistance semiconductor creates, in addition to a first conduction path where carriers (such as oxygen vacancies and electrons) pass through the nanowire, a second conduction path where carriers (such as oxygen vacancies and electrons) are injected from the nanowire into the oxide layer, travel through the oxide layer, and return to the nanowire. The present inventors found that the presence of these two conduction paths can produce a remarkable effect of fast response and high sensitivity to oxygen gas.

The primary features of the present disclosure, completed based on the above findings, are as follows.

[1] A gas sensor comprising:
a substrate having an insulating surface;
a first pad electrode and a second pad electrode each formed on or above the insulating surface of the substrate;
a nanowire connecting the first pad electrode and the second pad electrode and formed on or above the insulating surface of the substrate, the nanowire being made of at least one selected from the group consisting of platinum (Pt), palladium (Pd), rhodium (Rh), ruthenium (Ru), osmium (Os), iridium (Ir), and alloys thereof; and
an oxide layer in contact with the nanowire, the oxide layer being made of a high-resistance semiconductor that is an oxide of a metal different from a metal constituting the nanowire and at least satisfying one or both of the following conditions: (I) being located between the insulating surface of the substrate and the nanowire and in contact with a bottom surface of the nanowire, and (II) being located on the nanowire and in contact with a top surface of the nanowire,
wherein gas is detected based on changes in electrical signals detected across the first pad electrode and the second pad electrode with a current flowing across the first pad electrode and the second pad electrode.

[2] The gas sensor according to aspect [1], wherein the nanowire has a width of 5 nm or more and 150 nm or less, preferably 50 nm or less, and more preferably 30 nm or less.

[3] The gas sensor according to aspect [1] or [2], wherein the nanowire has a thickness of 1 nm or more and 20 nm or less, and preferably 10 nm or less.

[4] The gas sensor according to any one of aspects [1] to [3], wherein the nanowire has a length of 80 nm or more, preferably 400 nm or more, and 1 m or less.

[5] The gas sensor according to any one of aspects [1] to [4], wherein the high-resistance semiconductor constituting the oxide layer is at least one selected from the group consisting of cerium oxide, tin oxide, zirconium oxide, zinc oxide, tungsten oxide, iron oxide, nickel oxide, cerium-zirconium oxide, titanium oxide, cobalt oxide, niobium oxide, tantalum oxide, rhodium oxide, and hafnium oxide.

[6] The gas sensor according to any one of aspects [1] to [5], wherein the oxide layer has a thickness of 5 nm or more, and preferably 100 nm or less.

[7] The gas sensor according to any one of aspects [1] to [6], wherein the nanowire and the oxide layer are in ohmic contact with each other.

[8] The gas sensor according to any one of aspects [1] to [7], wherein the substrate is a glass substrate, an alumina substrate, a zirconia substrate, or a silicon substrate with a silicon oxide film formed on a surface thereof.

[9] The gas sensor according to any one of aspects [1] to [8], wherein the first pad electrode and the second pad electrode are made of the same type of metal as the nanowire.

[10] The gas sensor according to any one of aspects [1] to [9], wherein the gas is oxygen gas.

(Advantageous Effect)

The gas sensor according to the present disclosure has fast response and high sensitivity to oxygen gas.

BRIEF DESCRIPTION OF THE DRAWINGS

In the accompanying drawings:

FIG. 3 illustrates SEM images of the top surfaces of gas sensors with nanowires having various values of width W and length L;

FIG. 6 is a graph illustrating the variation of current I over time in Experimental Example 3;

FIG. 9 is a graph illustrating the variation of current I over time in Experimental Example 6;

DETAILED DESCRIPTION (Gas Sensor)

Figure 1A:
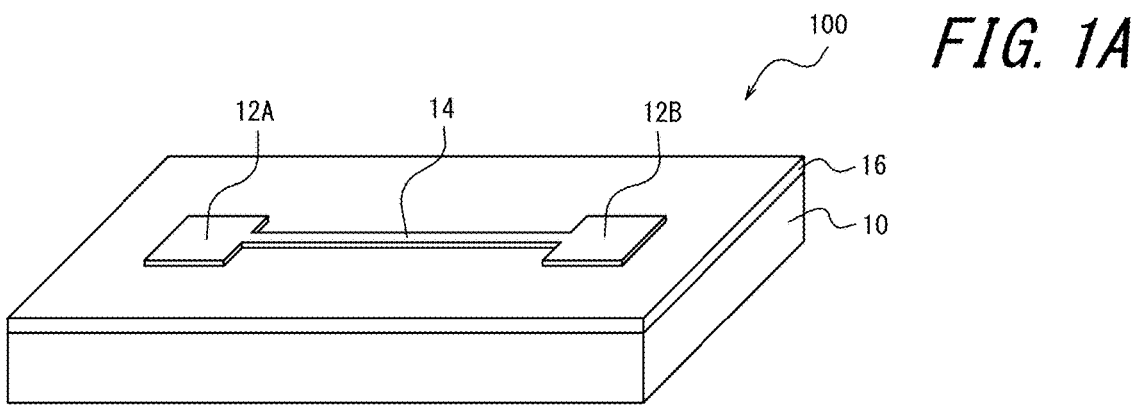
FIG. 1A is a schematic perspective view of a gas sensor 100 according to an embodiment of the present disclosure.
Figure 1B:
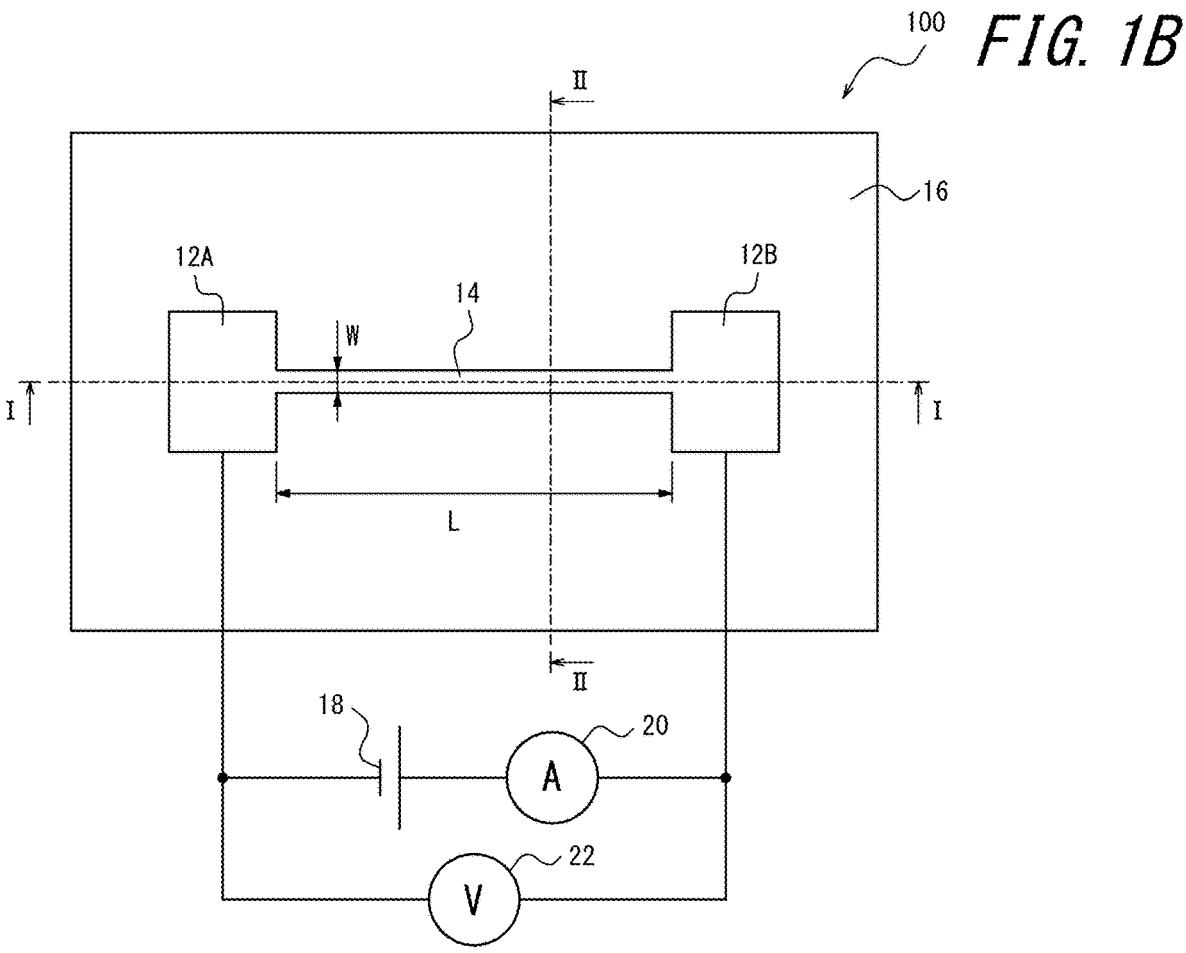
FIG. 1B is a schematic top view of the gas sensor 100.
Figure 1C:
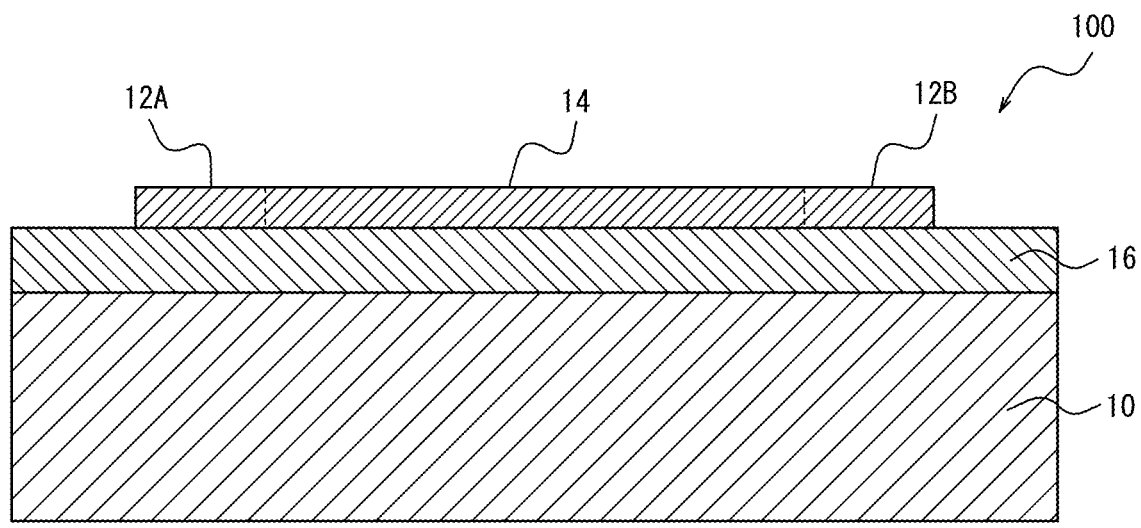
FIG. 1C is a I-I cross section of FIG. 1B.
Figure 1D:
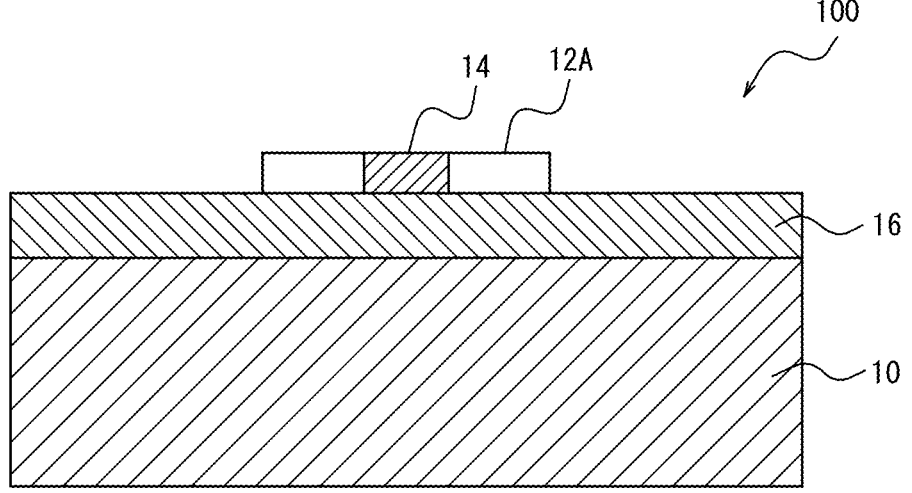
FIG. 1D is a II-II cross section of FIG. 1B.

Referring to FIGS. 1A, 1A, 1C, and 1D, the gas sensor 100 according to an embodiment of the present disclosure comprises: a substrate 10; a first pad electrode 12a and a second pad electrode 12b; a nanowire 14 made of a specific metal; and an oxide layer 16 made of a high-resistance semiconductor. The first pad electrode 12A and the second pad electrode 12B are formed on or above the substrate 10. The nanowire 14 connects the first pad electrode 12A and the second pad electrode 12B and is formed on or above the substrate 10. The oxide layer 16 is formed in contact with the nanowire 14. Although the detailed actions and effects will be described later, in this embodiment, this contact between the nanowire 14 and the oxide layer 16 provides fast response and high sensitivity to oxygen gas. As used herein, "element A formed on or above element B" shall mean that the element A is formed directly, or indirectly through another layer in between, on the element B.

[Mechanism of Gas Detection]

In the gas sensor 100, gas is detected based on changes in electrical signals detected across the first pad electrode 12A and the second pad electrode 12B with a current flowing across the first pad electrode 12A and the second pad electrode 12B. For example, as illustrated in FIG. 1B, a power supply 18 and an ammeter 20 are connected in series across the first pad electrode 12A and the second pad electrode 12B, and a voltmeter 22 is connected in parallel with the series arrangement of the power supply and the ammeter. In this case, while a constant voltage is applied across the first pad electrode 12A and the second pad electrode 12B by the power supply 18, changes in current across the first pad electrode and the second pad electrode is detected by the ammeter 20, and gas is detected based on the detected current changes. Alternatively, gas may be detected based on changes in voltage detected across the first pad electrode 12A and the second pad electrode 12B with a constant current flowing across the first pad electrode 12A and the second pad electrode 12B . Alternatively, gas may also be detected based on changes in resistance, instead of the changes in current or voltage, detected across the first pad electrode 12A and the second pad electrode 12B. In other words, the term "electrical signals" means current, voltage, or resistance. In this embodiment, the circuit of the gas sensor can be constructed with two terminals, and thus there i s no need to increase wires or circuits for construction of the gas sensor. Although the type of gas to be detected is not limited, this embodiment is suitable for detecting oxygen gas.

[ Substrate]

The substrate 10 supports the first pad electrode 12A and the second pad electrode 12B, as well as the nanowire 14 and the oxide layer 16, which serve as a gas detection section. The substrate 10 is not limited to a particular substrate as long as it has an insulating surface, yet it may be, for example, an insulating substrate such as a glass substrate, an alumina substrate, or a zirconia substrate, or a silicon substrate with a silicon oxide film formed on a surface thereof. The shape and dimensions of the substrate 10 are not particularly limited, yet in a case where a substrate with a rectangular main surface is used as the substrate 10, the dimensions can be, for example, 10 mm to 300 mm in length×10 mm to 300 mm in width×0.3 mm to 1.2 mm in thickness.

[First Pad Electrode and Second Pad Electrode]

The first pad electrode 12A and the second pad electrode 12B are a pair of electrodes necessary to supply current to the nanowire 14 and to detect changes in electrical signals corresponding to changes in gas concentration. The shape and dimensions of the first pad electrode 12A and the second pad electrode 12B are not particularly limited as long as they are formed on or above the insulating surface of the substrate 10. However, in a case where the shape of the main surface is rectangular, the dimensions can be, for example, 30 μm to 500 μm in length×30 μm to 500 μm in width×10 nm to 500 nm in thickness. The metal that constitutes the first pad electrode 12A and the second pad electrode 12B is not particularly limited and may be any metal. However, due to process simplicity, it is preferable to use the same type of metal as the nanowire described below.

[Nanowire]

The nanowire 14 is one of the elements that make up the gas detection section. The nanowire 14 connects the first pad electrode 12A and the second pad electrode 12B and is formed on or above the insulating surface of the substrate 10. It is important that the nanowire 14 be made of at least one selected from the group consisting of platinum (Pt), palladium (Pd), rhodium (Rh), ruthenium (Ru), osmium (Os), iridium (Ir), and alloys thereof. Among them, the nanowire 14 is preferably made of at least one selected from the group consisting of platinum (Pt), palladium (Pd), and their alloys, and most preferably made of at least one selected from the group consisting of platinum (Pt) and its alloys. These elements used in the nanowire 14 are platinum group elements and function as catalysts. Platinum group elements as catalysts activate gases, promote gas adsorption and chemical reactions between oxides and gases, increase the amount of oxygen adsorbed, and increase oxygen ions. These catalytic effects increase the sensitivity of the gas response.

The shape of the nanowire 14 is not particularly limited, yet the cross- sectional shape perpendicular to the direction of extension of the nanowire 14 is preferably rectangular, as illustrated in FIG. 1D.

The width W of the nanowire 14 is not particularly limited as long as it is on the order of nanometers (i.e., less than 1 μm). However, from the viewpoint of more fully achieving fast response and high sensitivity to oxygen gas, it is preferably 150 nm or less, more preferably 50 nm or less, and even more preferably 30 nm or less. The lower limit of the width W of the nanowire 14 is not particularly limited, because a narrower nanowire is preferable from the viewpoint of fast response and high sensitivity. However, due to process constraints, the width W of the nanowire 14 is preferably 5 nm or more.

The thickness of the nanowire 14 is not particularly limited, yet from the viewpoint of more fully achieving fast response and high sensitivity to oxygen gas, it is preferably 20 nm or less, and more preferably 10 nm or less. The lower limit of the thickness of the nanowire 14 is also not particularly limited, because a thinner nanowire is preferable in terms of fast response and high sensitivity. However, from the viewpoint of process constraints and electrical conduction as a nanowire, the thickness of the nanowire 14 is preferably 1 nm or more.

The cross-sectional area perpendicular to the direction of extension of the nanowire 14 is not particularly limited, yet from the viewpoint of more fully achieving fast response and high sensitivity to oxygen gas, it is preferably 3000 $nm^2$ or less, more preferably 1500 $nm^2$ or less, further more preferably 1000 $nm^2$ or less, still more preferably 600 $nm^2$ or less, even more preferably 500 $nm^2$ or less, and still even more preferably 300 $nm^2$ or less. The lower limit of the cross-sectional area perpendicular to the direction of extension of the nanowire 14 is also not particularly limited, because a smaller cross-sectional area is preferable in terms of fast response and high sensitivity. However, due to process constraints, the cross-sectional area perpendicular to the direction of extension of the nanowire 14 is preferably 15 $nm^2$ or more.

The length L of the nanowire 14 is not particularly limited, yet from the viewpoint of more fully achieving fast response and high sensitivity to oxygen gas, it is preferably 80 nm or more, and more preferably 400 nm or more. The upper limit of the length L of the nanowire 14 is also not particularly limited, because a longer nanowire is preferable in terms of fast response and high sensitivity. However, due to process constraints, the length L of the nanowire 14 is preferably 1 m or less.

[Oxide Layer]

The oxide layer 16 is made of a high-resistance semiconductor and is in contact with the nanowire 14. This contact between the nanowire 14 and the oxide layer 16 provides fast response and high sensitivity to oxygen gas in this embodiment. As for the contact mode between the nanowire 14 and the oxide layer 16, it is important for the oxide layer 16 to at least satisfy one or both of the following conditions: (I) being located between the insulating surface of the substrate 10 and the nanowire 16 and in contact with a bottom surface of the nanowire 14, and (II) being located on the nanowire and in contact with a top surface of the nanowire.

As illustrated in FIG. 1A, this embodiment is related to the above condition (I), wherein the oxide layer 16 is located on the insulating surface of the substrate 10, and the first pad electrode 12a, the second pad electrode 12b, and the nanowire 14 are located on the oxide layer 16. However, the present disclosure is not so limited, and may be also related to the above condition (II). For example, the first pad electrode 12A, the second pad electrode 12B, and the nanowire 14 may be located on the insulating surface of the substrate 10, and the oxide layer 16 may be formed on the nanowire 14. The above conditions (I) and (II) also encompass cases where the nanowire 14 is buried in the oxide layer 16 and where the oxide layer 16 is in contact with the side surfaces of the nanowire 14 in addition to the top and bottom surfaces thereof.

The high-resistance semiconductor constituting the oxide layer 16 can be any oxide semiconductor with a resistivity at 300° C. of 1 Ω·m or more and 100,000 Ω·m or less, and is preferably at least one selected from the group consisting of, for example, cerium oxide ($CeO_2$), tin oxide ($SnO_2$), zirconium oxide ($ZrO_2$), zinc oxide (ZnO), tungsten oxide ($WO_3$), iron oxide ($Fe_2O_3$), nickel oxide (NiO), cerium-zirconium oxide ($CeZrO_4$), titanium oxide ($TiO_2$), cobalt oxide ($Co_3O_4$), niobium oxide ($Nb_2O_5$), tantalum oxide ($Ta_2O_5$), rhodium oxide ($Rh_2O_3$), and hafnium oxide ($HfO_2$); among these particularly preferred are cerium oxide, tin oxide, and zirconium oxide. The aforementioned oxide semiconductor may not only be an oxide with a stoichiometric composition, but also an oxide that deviates from its stoichiometric composition, and may contain oxides with different oxidation numbers. Oxygen is adsorbed on a surface of the oxide semiconductor that constitutes the oxide layer 16. The adsorbed oxygen draws electrons from the oxide semiconductor and becomes oxygen ions such as $O^-$ and $O^{2-}$. Since oxygen ions $O^-$ and $O^{2-}$ have a negative charge, they deplete the surface and decrease electrical conductivity in the case of an n-type semiconductor, while they increase the carrier concentration and increase electrical conductivity in the case of a p-type semiconductor. When oxygen ions adsorbed on the surface chemically react with the gas, the oxygen ions are removed and the surface charge caused by the oxygen ions disappears. This changes the electrical conductivity of the oxide semiconductor. This change in electrical conductivity in the oxide semiconductor will result in a change in electrical conductivity parallel to the nanowire, leading to the detection of a gas response.

It is important that the high-resistance semiconductor (oxide semiconductor) constituting the oxide layer 16 be an oxide of a metal different from a metal constituting the nanowire 14. As for the adsorption, formation, and annihilation of oxygen/oxygen ions, as well as the formation and annihilation of oxygen vacancies, as described above, each process has its own activation energy, and those activation energies depend on the oxide semiconductor. For example, if the oxide semiconductor is an oxide of the metal constituting the nanowire 14, as in the $Pt/PtO_2$ combination, these activation energies are higher, resulting in slower response and longer recovery times, and thus lower sensitivity of the gas sensor. In contrast, if the oxide semiconductor is an oxide of a metal different from a metal constituting the nanowire 14, these activation energies are lower, resulting in faster response and shorter recovery times, and thus higher sensitivity of the gas sensor.

The thickness of the oxide layer 16 is not particularly limited, yet from the viewpoint of more fully achieving fast response and high sensitivity to oxygen gas, it is preferably 5 nm or more. As for the oxide layer 16 in the position satisfying the above condition (I), no upper limit is placed on its thickness. However, since even excessive thickness will saturate the effect of the present disclosure, the thickness of the oxide layer 16 is preferably 100 nm or less from the viewpoint of cost and process time. As for the oxide layer 16 in the position satisfying the above condition (II), no upper limit is placed on its thickness. However, since excessive thickness leads to poor gas permeability and insufficient gas supply to the nanowire 14, the thickness of the oxide layer 16 is preferably 100 nm or less.

[Contact between Nanowire and Oxide Layer]

As already mentioned, in this embodiment, it is important that the nanowire 14 and the oxide layer 16 are in contact, specifically, that they form an ohmic contact. This creates, in addition to a first conduction path where carriers (such as oxygen vacancies and electrons) pass through the nanowire 14, a second conduction path where carriers (such as oxygen vacancies and electrons) are injected from the nanowire 14 into the oxide layer 16, travel through the oxide layer 16, and return to the nanowire 14. The presence of these two conduction paths can provide a noticeable effect of fast response and high sensitivity to oxygen gas.

Although not limiting the present disclosure, the present inventors believe the mechanism by which this effect is achieved is as follows.

Oxides have oxygen deficiencies (oxygen vacancies) depending on the oxygen concentration, and the lower the oxygen concentration, the higher the oxygen defect density. Such oxygen-deficient sites act as donor sites that trap electrons and release them. The electrons released from the oxygen deficiencies are supplied to the conductor to become carriers that undergo band-like transport or hopping transport between the oxygen-deficient sites.

The metal (such as Pt or Pd) constituting the nanowire contributes to the reduction of activation energy to produce oxygen defects by catalytic action, facilitating the formation of oxygen defects. Furthermore, it lowers the activation energy of electron transfer (charge injection) at the metal/oxide interface and reduces the height of the Schottky barrier that exists between the metal and oxide. Oxygen defects also increase the carrier density near the interface, which contributes to making the Schottky barrier width as thin as a few 10 nm. Both the barrier height reduction by means of catalysis and the carrier density increase due to oxygen defects reduce the resistance based on the Schottky barrier between the metal and oxide, enabling ohmic contact. At the ohmic contact interface, the resistance is almost constant regardless of the electric field at the interface, and electron transfer at the metal/oxide interface is less inhibited.

Atoms of the metal (such as Pt or Pd) in contact with the oxide diffuse into the oxide relatively easily during metal deposition on the oxide or during annealing at several hundred degrees Celsius, and are atomically doped into the oxide. When metal atoms are doped into the oxide in this way, the catalytic activity is extremely high compared to bulk metals. In a metal atom-doped oxide, compared to undoped oxides, the higher catalytic activity tends to generate more oxygen defects, resulting in a lower barrier height and a thinner barrier width due to increased carrier concentration. Due to these effects, doping of metal atoms into the oxide contributes to improved gas sensor response due to the ease of oxygen defect generation, the formation of ohmic contacts, reduced ohmic resistance, and improved conductivity of electrons in the oxide.

Through ohmic contact at the metal/oxide interface, electrons injected from the metal into the oxide can flow through the oxide by band-like transportation or hopping transportation and return to the ohmic-contacting nanowire. When voltage is applied across both ends of the nanowire, where the metal nanowire is in contact with the oxide, electron conduction in the metal occurs within the nanowire, which is a metal. To this electron conduction within the wire will be added electron conduction through a conduction path (bypass circuit) in which the charge injected from the metals into the oxide is conducted through the oxide and back to the metal. The current flowing through the bypass circuit through the oxide is strongly dependent on the oxygen defect concentration, making the gas sensor response highly sensitive.

In ohmic contacts, the frequency of electron injection between the metal/oxide is independent of the voltage applied across the wire ends because the contact resistance is independent of the electric field. This leads to the results of the present disclosure that even at applied voltages of, for example, a few 10 mV, the gas sensor response is as good as at higher applied voltages.

It has been reported that metal oxidation on metal surfaces increases surface scattering in metal conduction and that the change in conductivity due to greater or lesser surface scattering provides the gas sensor response. Reducing action takes place at the metal/oxide interface where the oxide is in contact with the metal and an oxygen deficiency is caused in the oxide. This reducing action leads to the reduction of metals whose surfaces are oxidized. At the metal interface in contact with the oxide, the metal is less likely to oxidize due to the reducing effect, which acts to reduce surface scattering in metal conduction within the metal wire. Furthermore, as evidenced by the formation process of ohmic contacts, surface scattering at the metal/oxide contact interface becomes dependent on the oxygen defect concentration, which changes the barrier height and barrier width at the Schottky interface. Gas sensors using changes in the frequency of surface scattering in electrical conduction of a metal nanowire and the gas sensor disclosed herein have different surface scattering mechanisms in electrical conduction in that the gas sensor disclosed herein undergoes surface scattering contributed by oxygen deficiencies in the oxide, rather than surface scattering caused by oxidation on the surface of a single metal as described above.

[Effects]

As described above, the gas sensor 100 of this embodiment has fast response (i.e., short response time and short recovery time) and high sensitivity to oxygen gas. The gas sensor 100 of this embodiment also has the effect that oxygen gas can be detected even at low operating temperatures (e.g., about 60° C. to about 300° C.). The gas sensor 100 of this embodiment also has the effect of enabling detection of a wide range of oxygen gas concentrations because it can detect oxygen gas even at low concentrations.

[Method of Producing Gas Sensor]

Referring to FIGS. 2A to 2E, a suitable method of producing the gas sensor 100 of this embodiment is described.

Figure 2A:
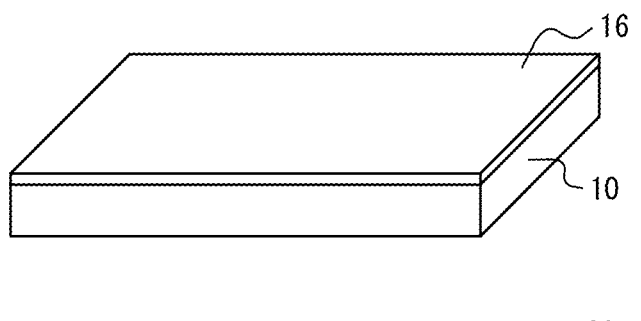
FIGS. 2A to 2E illustrate the manufacturing process of the gas sensor 100 according to an embodiment of the present disclosure.

Referring to FIG. 2A, first, an oxide layer 16 is formed on a substrate 10. Specifically, a precursor solution of the oxide constituting the oxide layer 16 is prepared and applied to the substrate 10, and the substrate 10 is then subjected to heat treatment. For example, in the case of forming a cerium oxide ($CeO_2$ ) layer, a cerium oxide ($CeO_2$ ) precursor solution of a predetermined concentration can be prepared by dissolving cerium acetate hydrate $Ce(CH_3CO_2)_3 \cdot xH_2O$ in propionic acid.

Listed below are the precursor materials used to obtain oxides. One or more of these precursor materials can be used.

Cerium oxide ($CeO_2$ ): cerium acetate hydrate $Ce(CH_3CO_2)_3 \cdot xH_2O$; cerium nitrate hexahydrate $Ce[NO_3]_3 \cdot 6H_2O$; cerium acetylacetonate hydrate $Ce[CH_5H_7O_2]_3 \cdot xH_2O$ Tin oxide ($SnO_2$): anhydrous tin(II) chloride $SnCl_2$: tin(II) acetylacetonate $C_{10}H_{14}O_4Sn$; tin(IV) tert-butoxide $Sn[OC(CH_3)_3]_4$ Zirconium oxide ($ZrO_2$): zirconium(IV) butoxide $Zr(OC_4H_9)_4$; zirconium(IV) isopropoxide isopropanol complex $Zr(OCH(CH_3)_2)_4$ $(CH_3)_2CHOH$; zirconium(IV) oxynitrate hydrate $ZrO(NO_3)_2 \cdot xH_2O$ Zinc oxide (ZnO): zinc nitrate hexahydrate $Zn[NO_3]_2 \cdot 6H_2O$; zinc(II) acetylacetonate $C_{10}H_{14}O_4Zn$; zinc acetate dihydrate $Zn[CH_3COO]_3 \cdot 2H_2O$ Tungsten oxide ($WO_3$): tungsten(VI) chloride $WCl_6$; tungsten(VI) ethoxide $C_{12}H_{30}O_6W$ Iron oxide ($Fe_2O_3$): iron nitrate nonahydrate $Fe[NO_3]_3 \cdot 9H_3O$; iron(II) acetate $Fe[CO_2CH_3]_2$; iron(III) acetylacetonate $Fe[C_5H_7O_2]_3$ Nickel oxide (NiO): nickel(II) acetylacetonate $Ni(C_5H_7O_2)_2$; nickel(II) acetate tetrahydrate $Ni[OCOCH_3]_2 \cdot 4H_2O$; nickel(II) nitrate hexahydrate $Ni[NO_3]_2 \cdot 6H_2O$ Cerium-zirconium oxide ($CeZrO_4$): cerium acetate hydrate $Ce(CH_3CO_2)_3 \cdot xH_2O$; zirconium(IV) butoxide $Zr(OC_4H_9)_4$ Titanium oxide ($TiO_2$): titanium(IV) isopropoxide $Ti[OCH(CH_3)_2]_4$; titanium(IV) butoxide $Ti(OCH_2CH_2CH_3)_4$ Cobalt oxide ($Co_3O_4$): cobalt nitrate hexahydrate $Co[NO_2]_2 \cdot 6H_2O$; cobalt(II) acetylacetonate $Co(C_5H_7O_2)_2$; cobalt(II) acetate $[CH_3CO_2]_2Co$; cobalt(II) chloride $CoCl_2$ Niobium oxide ($Nb_2O_5$): niobium(V) chloride $NbC_5$; niobium(V) ethoxide $Nb(OCH_2CH_3)_5$; niobium n-butoxide $C_{20}H_{45}NbO_5$ Tantalum oxide ($Ta_2O_5$): tantalum(V) ethoxide $Ta(OC_2H_5)_5$; tantalum(V) tetraethoxide 2,4-pentanedionate $C_{13}H_{27}O_6Ta$; tantalum(V) chloride $TaCl_5$ Rhodium oxide ($Rh_2O_3$): rhodium(II) acetate dimer $Rh_2(OOCCH_3)_4$; rhodium(III) nitrate hydrate $N_3O_9Rh \cdot xH_2O$; rhodium(III) acetylacetonate $[CH_2COCHCOCH_3]_3Rh$ Hafnium oxide ($HfO_2$): hafnium(IV) chloride $HfC_4$; hafnium(IV) 2,4-pentanedionate $C_{20}H_{28}O_8Hf$; hafnium(IV) nitrate $Hf(NO_3)_4$ One or more of the following solvents can be used: propionic acid, 2-methoxyethanol($CH_3OCH_2CH_2OH$), and 1-butanol($C_4H_9OH$). The concentration of the precursor solution is not particularly limited, yet is preferably about 0.05 mol/kg to about 0.5 mol/kg, depending on the desired film thickness. The application method is not particularly limited, yet spin- coating can be suitably used. In such cases, the rotation speed can be determined according to the desired thickness, and may be in the range of 1,000 rpm to 4,000 rpm, for example. The oxide layer 16 is required to have two functions: electrical conductivity and gas permeability. In order to obtain high electrical conductivity, it is necessary to form conduction paths; if there are grain boundaries, carrier traps in the boundaries make it difficult to obtain a response. On the other hand, a porous structure with good gas permeability is desirable to achieve an increase or decrease of oxygen vacancies in oxides near the nanowire with respect to the gas atmosphere. From the viewpoint of obtaining these two functions, the preferred heat treatment condition is to maintain the heat treatment in an air atmosphere for 0.5 hours to 2 hours at an ambient temperature in the range of 250° C. to 800° C. The thickness of the oxide layer 16 may be adjusted by performing the combination of application and heat treatment multiple times.

Figure 2B:
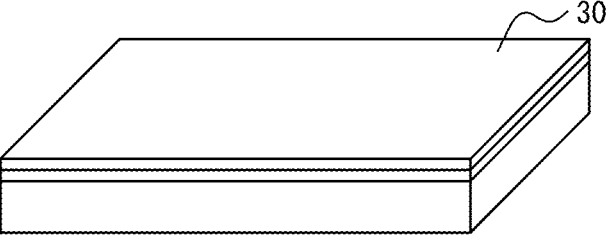

Next, as illustrated in FIG. 2B, a resist film 30 is formed on the oxide layer 16. The resist film 30 can be formed by applying a photoresist composition for electron beam exposure onto the oxide layer 16 and allowing it to dry. The application method is not particularly limited, yet spin-coating can be suitably used. The thickness of the resist film 30 may be set appropriately so that it is thicker than the thickness of the nanowire 14 to be formed (or thicker than both the nanowire 14 and the pad electrodes 12A and 12B, if they are formed in a batch).

Figure 2C:
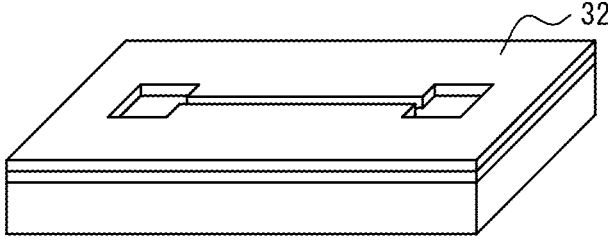
Figure 2D:
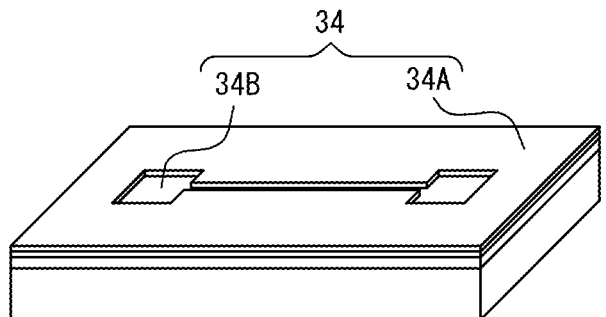
Figure 2E:
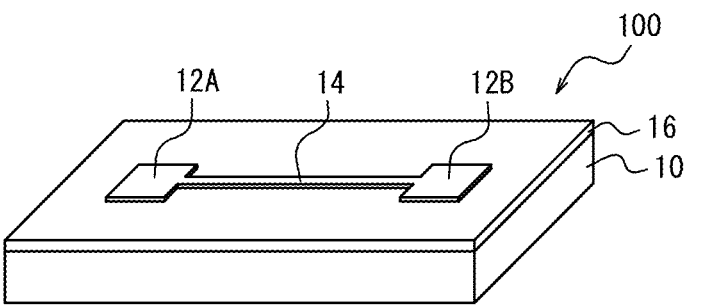

Next, as illustrated in FIG. 2C, the resist film 30 is developed to form a mask pattern 32 with a predetermined shape. The mask pattern 32 is created by exposing and developing the resist film 30 by electron beam lithography. The shape of the mask pattern 32 may be set appropriately according to the width W and length L of the nanowire 14 to be formed. As illustrated in FIGS. 2C to 2E, when the nanowire 14 and the pad electrodes 12A and 12B are formed in a batch, the shape of the mask pattern 32 may be determined according to the dimensions of the nanowire 14 and the pad electrodes 12A and 12B to be formed. In the mask pattern 32, where the resist film has been removed, the oxide layer 16 is exposed.

Next, as illustrated in FIG. 2D, a metal film 34 is formed by, for example, electron beam evaporation or sputtering. At this time, a first portion 34A of the metal film is formed on the mask pattern 32, and a second portion 34B of the metal film is formed on the oxide layer 16 at the portion where the resist film has been removed in the mask pattern 32. Preferably, the metal film 34 includes: a Ti layer with a thickness of about 1 nm to about 5 nm; and a 15 layer of metal (e.g., Pt) constituting the nanowire 14 and the pad electrodes 12A and 12B formed on top of the Ti layer. The Ti layer serves as an adhesive layer for bonding the layers made of a metal constituting the nanowire 14 and the pad electrodes 12A and 12B on the oxide layer 16. A Cr layer may be used as an adhesive layer instead of the Ti layer.

Next, as illustrated in FIG. 2E, the nanowire 14 and the pad electrodes 12A and 12B are formed on the oxide layer 16 by a lift-off process that peels off the mask pattern 32 and removes the first portion 34A of the metal film formed on it. This case has been described in the context of forming the nanowire 14 and the pad electrodes 12A and 12B in a batch as illustrated in FIGS. 2C to 2E. However, it is also possible to form only the nanowire 14 in the above process and then separately form the pad electrodes 12A and 12B using, for example, a general photolithography method. Although the Ti or Cr layer is formed as an adhesive layer to bond the nanowire 14 on the oxide layer 16, most of the Ti or Cr layer is lost as Ti or Cr diffuses into the metal layer during the process of deposition of the metal constituting the nanowire 14.

Between the oxide layer 16 and the nanowire 14, Ti or Cr remains in island form in some places, yet in most places the oxide layer 16 and the nanowire 14 are in direct contact, forming ohmic contacts.

Through the above process, the gas sensor 100 can be fabricated. The gas sensor 100 fabricated by the steps illustrated in FIGS. 2A to 2E is related to the above condition (I) in terms of the contact mode between the nanowire 14 and the oxide layer 16. By reversing the formation order of the nanowire 14 and the oxide layer 16 (i.e., reversing the order of the step in FIG. 2A and the steps in FIGS. 2B to 2E), a gas sensor can be fabricated in which the contact mode between the nanowire 14 and the oxide layer 16 satisfies the above condition (II). However, in this case, the oxide layer 16 is also formed on the pad electrodes 12A and 12B. Therefore, the oxide layer 16 on the pad electrodes 12A and 12B should be removed by, for example, argon sputtering, reactive ion etching, or physical scratching to enable electrical contact to be made from the pad electrodes 12A and 12B.

EXAMPLES

[Experimental Example 1]

<Fabrication of Gas Sensor>

A gas sensor was fabricated according to the following procedure. First, a Si substrate (15 mm long×15 mm wide× 0.5 mm thick) with a surface layer of approximately 1 μm made of $SiO_2$ was prepared.

Next, a 0.4 mol/kg cerium oxide ($CeO_2$) precursor solution was prepared by dissolving cerium acetate hydrate $Ce(CH_3CO_2)_3 \cdot xH_2O$ (in 99.9%, from Sigma-Aldrich) in propionic acid (from Wako Chemical Co., Ltd.). After mixing, the precursor solution was stirred on a hot plate (110° C.) at 1,000 rpm for 30 minutes to make a clear and uniform solution. The solution was then passed through a 0.2-μm PTFE syringe filter and stored at 4° C.

A cerium oxide ($CeO_2$) layer (thickness: 28 nm) was formed on the substrate by applying the precursor solution by spin-coating at 4,000 rpm and performing heat treatment at 250° C. for 1 hour using a rapid thermal annealer (RTA). Note that the resistivity of cerium oxide ($CeO_2$) at 300° C. is 200 Ω·m.

A Pt nanowire was then formed on the Ce02 layer using an electron beam writer EBL (ELS-7500EX from Elionix Inc.). Specifically, an electron beam resist ZEP-520A was applied on the $CeO_2$ layer by spin-coating, and then a mask pattern with a predetermined shape was drawn by the EBL. Then, a Ti layer (thickness: 3 nm) and a Pt layer (thickness: 10 nm) on the Ti layer were formed by electron beam evaporation. Then, a Pt nanowire (width W: 8 nm, thickness: 10 nm, length L: 416 nm, cross-sectional shape perpendicular to the nanowire: rectangular) was formed on the $CeO_2$ layer via a lift-off process to peel off the mask pattern. Note that although the Ti layer was formed as an adhesive layer to bond the Pt nanowire on the $CeO_2$ layer, most of the Ti layer was lost as Ti diffused into the Pt layer during the process of deposition of the Pt layer. Between the CeO2 layer and the Pt nanowire, Ti remained in island form in some places, yet in most places the $CeO_2$ layer and the Pt nanowire were in direct contact, forming ohmic contacts. That is, the $CeO_2$ layer was located between the substrate and the Pt nanowire and in contact with a lower surface of the Pt nanowire.

Subsequently, a first pad electrode and a second pad electrode (150 μm×150 μm), each being formed from a Ti layer (thickness: 5 nm) and a Pt layer (thickness: 40 nm) on the Ti layer, were fabricated using a general photolithography method. In this way, a gas sensor combining the $CeO_2$ layer and the Pt nanowire was fabricated.

<Oxygen Gas Detection Test>

Figure 4:
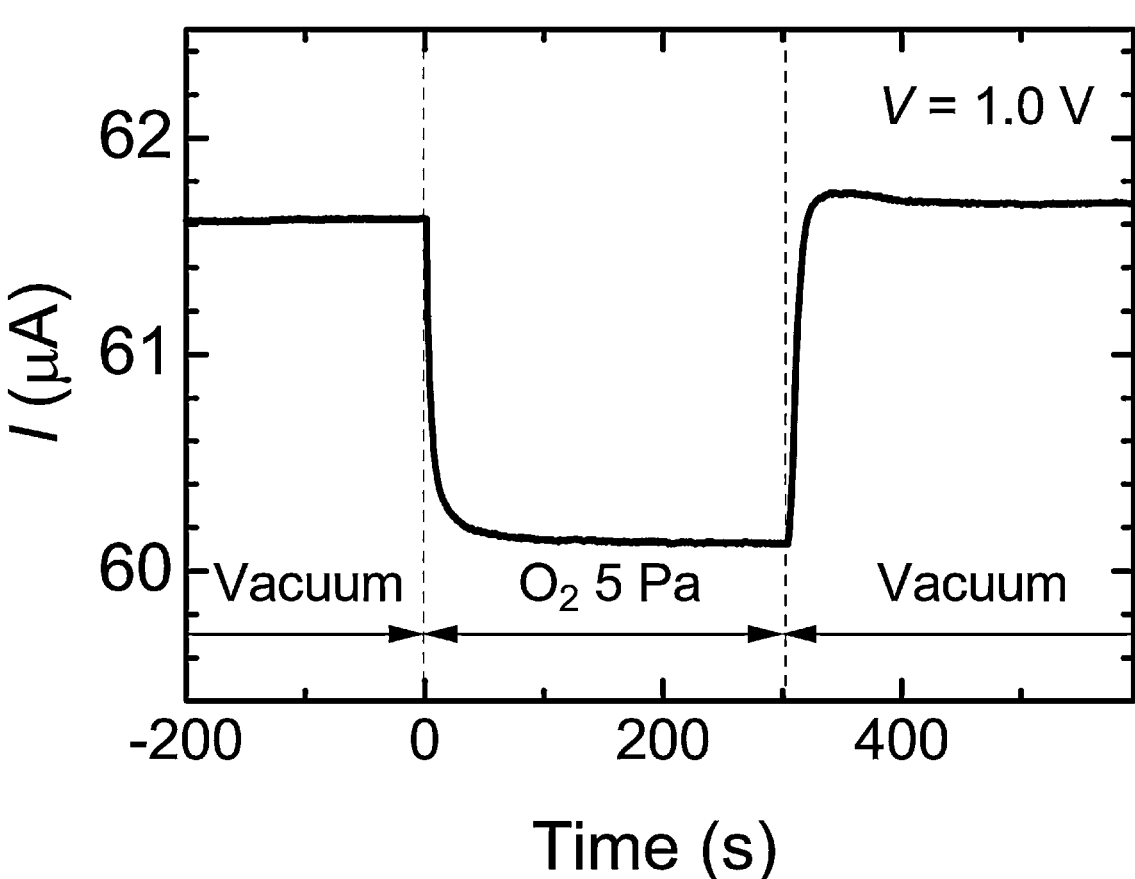
FIG. 4 is a graph illustrating the variation of current I over time in Experimental Example 1.

The above-described gas sensor was placed in a measurement chamber with variable oxygen pressure, and tests were conducted to detect oxygen gas using a semiconductor parameter analyzer system (B1500A from Keysight Technologies, Inc.) based on changes in current I detected across the first pad electrode and the second pad electrode, with a constant voltage (V=1.0 V) applied across the first and second pad electrodes, and various sensor characteristics were evaluated. The operating temperature T was set at 300° C. (573 K). The oxygen gas pressure was changed from $10^{-3}$ Pa (vacuum) to 5 Pa when the oxygen gas was turned on, and the oxygen gas pressure was returned from 5 Pa to $10^{-3}$ Pa (vacuum) when the oxygen gas was turned off. In other words, the oxygen pressure $P_{O2}$ was set at 5 Pa. No carrier gas was introduced into the measurement chamber, only the oxygen gas. The oxygen gas was turned on at 0 seconds and turned off at 300 seconds. FIG. 4 is a graph illustrating the variation of current I over time.

The parameters related to sensor characteristics are defined as follows.

I: Current value at a certain time $I_0$: Initial current value $I_{01}$: Initial current value (current value when the oxygen gas was turned on)

$I_{02}$: Initial current value (current value when the oxygen gas was turned off)

$I_s$: Saturation current value $I_{s1}$: Saturation current value (after the oxygen gas was turned on)

$I_{s2}$: Saturation current value (after the oxygen gas was turned off)

$\Delta I_1 = I_{01} - I_{s1}$ $\Delta I_2 = I_{02} - I_{s2}$

Sensitivity S $(\%)=(\Delta I_1/I_{01})\times 100$

Response time $t_{res}$:

Time required for current value I to change by 90% of $\Delta I_1$ from initial current value $I_{01}$ Recovery time $t_{rec}$:

Time required for current value I to change by 90% of $\Delta I_2$ from initial current value $I_{02}$ If the current value did not saturate after 300 seconds after the oxygen gas was turned on or off, the current value at 300 seconds after the oxygen gas was turned on or off was considered as the saturation current value.

In this experimental example, the response time $t_{res}$ was 21 seconds and the recovery time $t_{rec}$ was 20 seconds, indicating fast response to oxygen gas. The sensitivity S was 2.4%, indicating high sensitivity to oxygen gas.

[Experimental Example 2]

Figure 5:
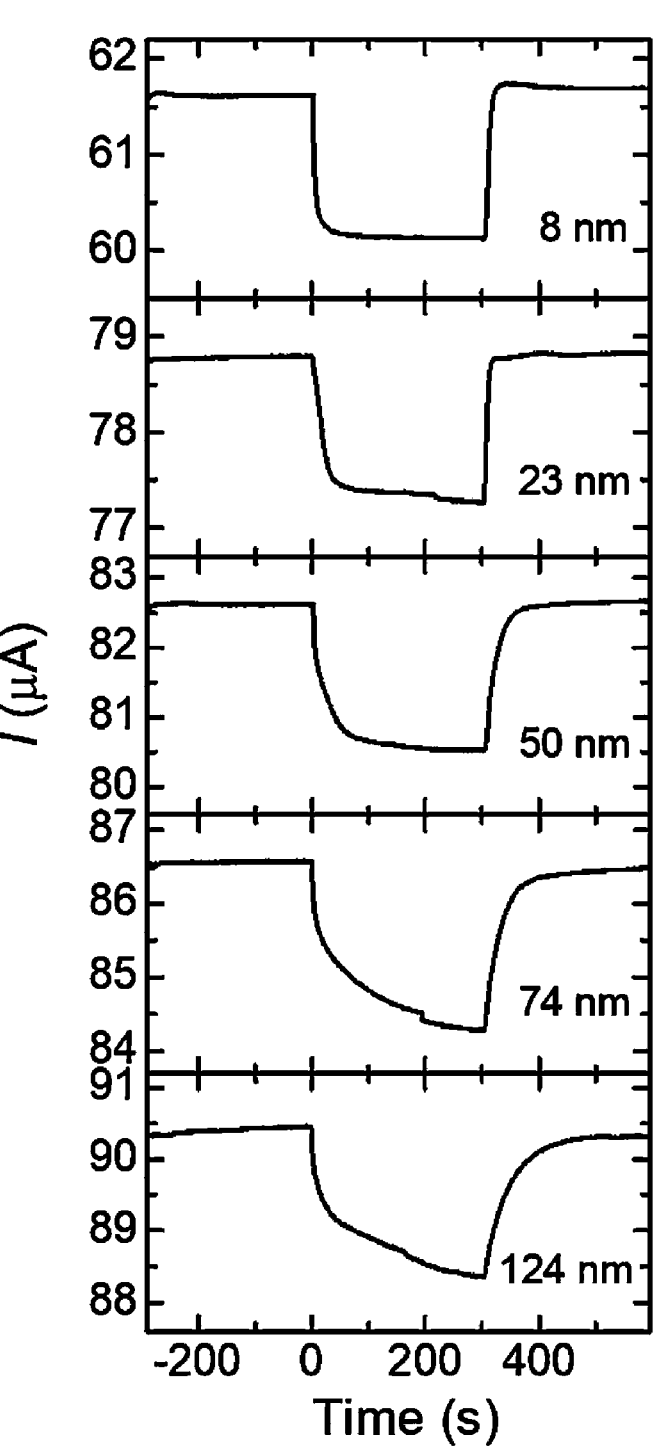
FIG. 5 is a graph illustrating the variation of current I over time in Experimental Example 2.

Gas sensors were fabricated under the same conditions as in Experimental Example 1, except that the width W of the Pt nanowire was set at 5 levels including, in addition to 8 nm, 23 nm, 50 nm, 74 nm, and 124 nm (see left side of FIG. 3). Oxygen gas detection tests were then conducted under the same conditions as in Experimental Example 1 (applied voltage V=1.0 V, operating temperature T=300° C. (573 K), oxygen pressure $P_{O2}$=5 Pa). The oxygen gas was turned on at 0 seconds and turned off at 300 seconds. FIG. 5 is a graph illustrating the variation of current I over time at each level. The sensor performance at each level is listed in Table 1.

TABLE 1

| Width W (nm) | Response time $t_{res}$ (sec) | Recovery time $t_{rec}$ (sec) | Sensitivity S (%) |
| --- | --- | --- | --- |
| 8 | 21 | 20 | 2.4 |
| 23 | 60 | 15 | 1.9 |
| 50 | 69 | 52 | 2.2 |
| 74 | 195 | 73 | 2.3 |
| 124 | 190 | 105 | 2.0 |

As can be seen from Table 1, the narrower the width W, the faster response to oxygen gas was achieved. On the other hand, the sensitivity S was less dependent on the width W.

[Experimental Example 3]

Figure 6:
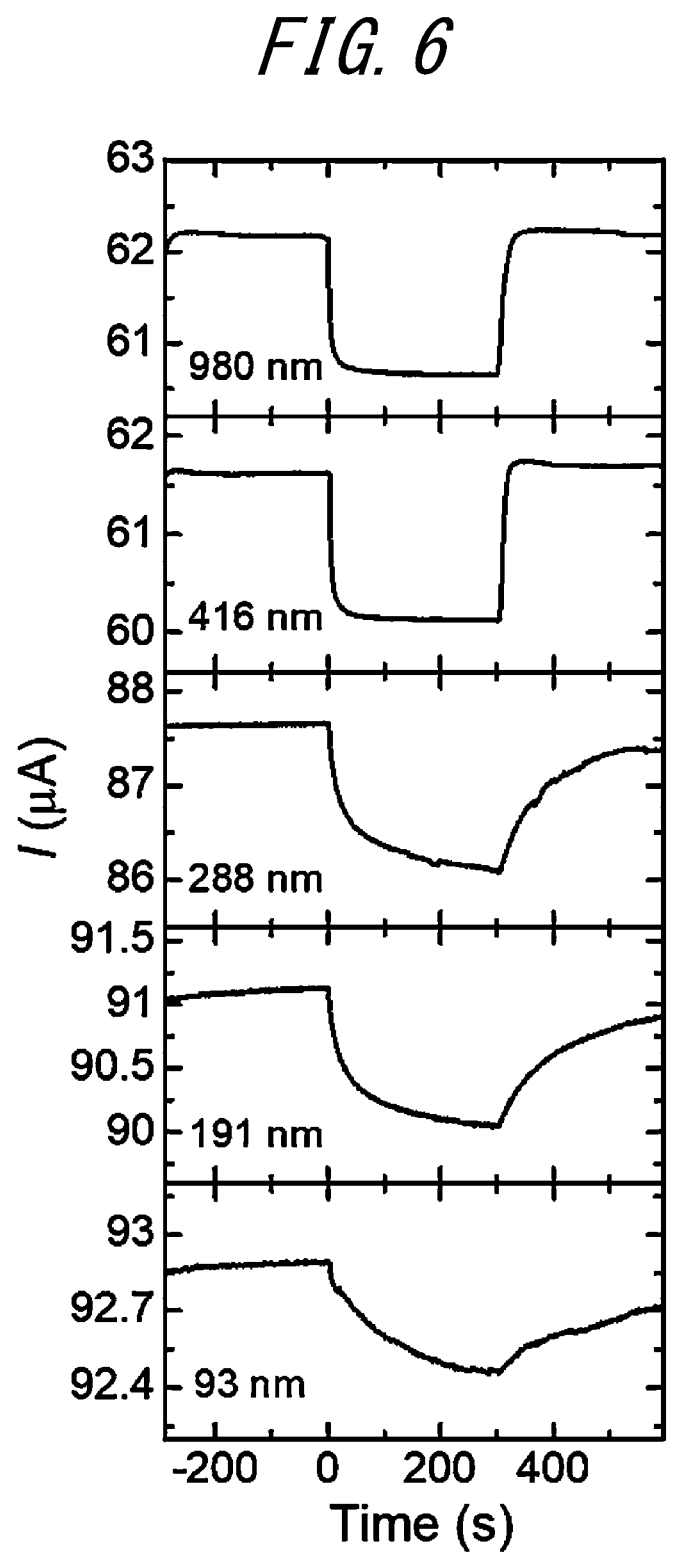

Gas sensors were fabricated under the same conditions as in Experimental Example 1, except that the length L of the Pt nanowire was set at 5 levels including, in addition to 416 nm, 980 nm, 288 nm, 191 nm, and 93 nm (see right side of FIG. 3). Oxygen gas detection tests were then conducted under the same conditions as in Experimental Example 1 (applied voltage V=1.0 V, operating temperature T=300° C. (573 K), oxygen pressure $P_{O2}$=5 Pa). The oxygen gas was turned on at 0 seconds and turned off at 300 seconds. FIG. 6 is a graph illustrating the variation of current I over time at each level. The sensor performance at each level is listed in Table 2.

TABLE 2

| Length L (nm) | Response time $t_{res}$ (sec) | Recovery time $t_{rec}$ (sec) | Sensitivity S (%) |
| --- | --- | --- | --- |
| 980 | 18 | 23 | 2.4 |
| 416 | 21 | 20 | 2.4 |
| 288 | 146 | 155 | 1.8 |

TABLE 2-continued

| Length L (nm) | Response time $t_{res}$ (sec) | Recovery time $t_{rec}$ (sec) | Sensitivity S (%) |
| --- | --- | --- | --- |
| 191 | 143 | 210 | 1.2 |
| 93 | 185 | 236 | 0.5 |

As can be seen from Table 2, the longer the length L, the faster response and higher sensitivity to oxygen gas were achieved.

[Experimental Example 4]

Figure 7A:
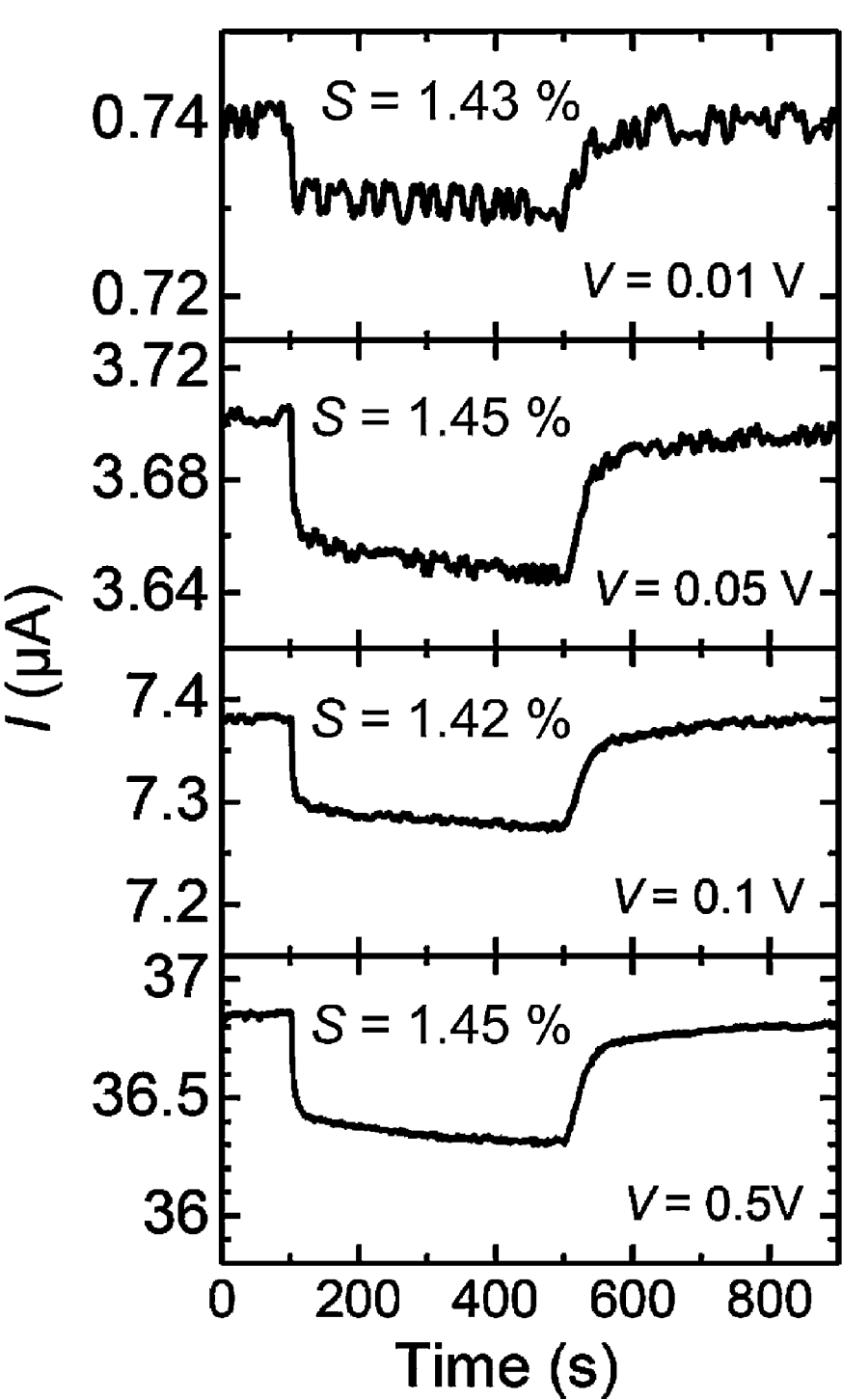
FIG. 7A is a graph illustrating the variation of current I over time in Experimental Example 4.
Figure 7B:
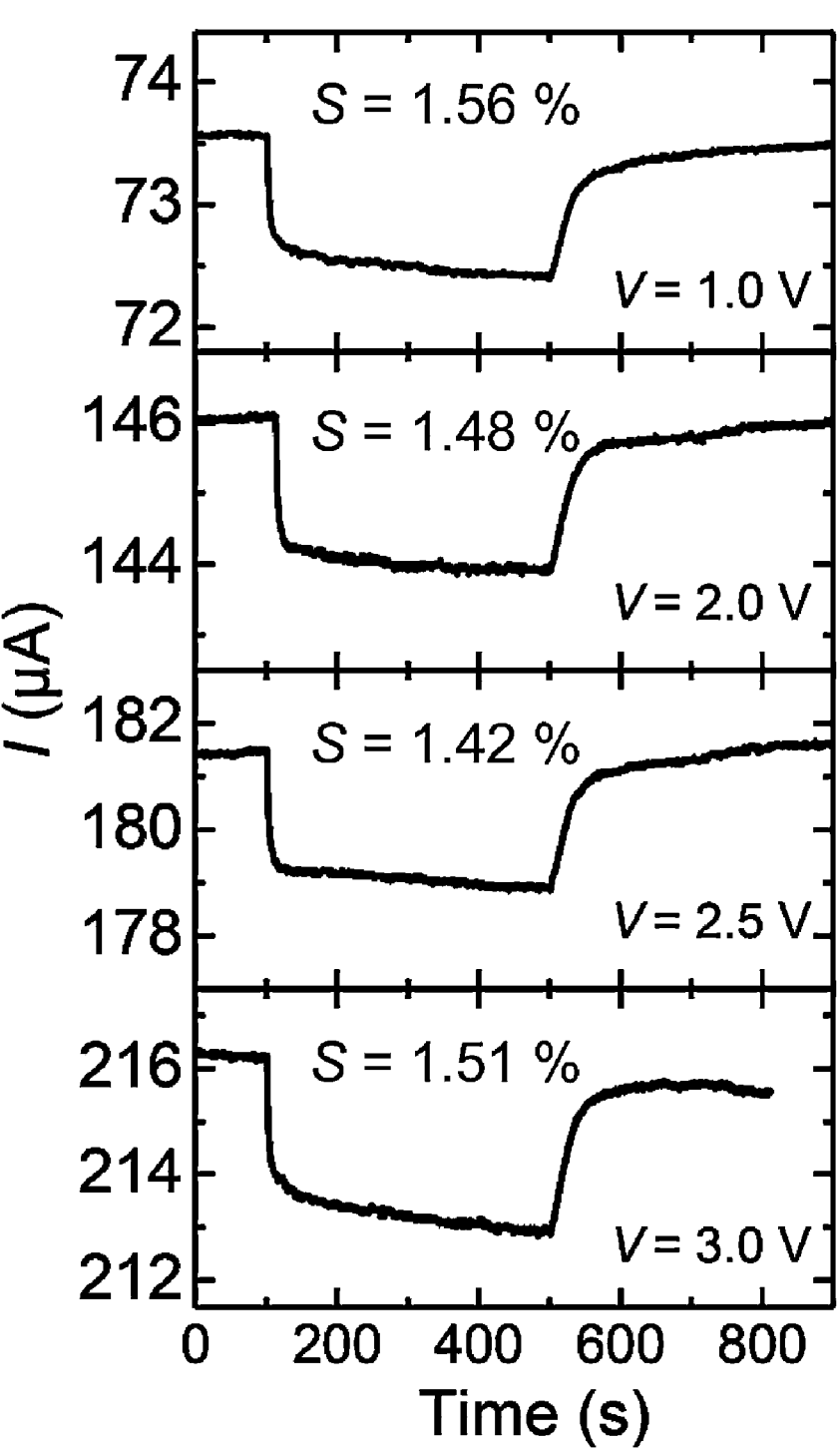
FIG. 7B is a graph illustrating the variation of current I over time in Experimental Example 4.

Gas sensors were fabricated under the same conditions as in Experimental Example 1. Then, oxygen gas detection tests were conducted under the same conditions as in Experimental Example 1 (operating temperature T=300° C. (573 K), oxygen pressure $P_{O2}$=5 Pa), except that the applied voltage V was set at various levels (0.01 V, 0.05 V, 0.1 V, 0.5 V, 1.0 V, 2.0 V, 2.5 V, and 3.0 V). The oxygen gas was turned on at 100 seconds and turned off at 500 seconds. FIGS. 7A and 7B are graphs illustrating the variation of current I over time at each level. The sensitivity S at each level is also noted in the graph.

From FIGS. 7A and 7B, it can be read that the response and recovery times are independent of the applied voltage V. The sensitivity S is also independent of the applied voltage V and is almost the same in the range of 1.42% to 1.56%. Responses are also observed at an applied voltage V of 10 mV. Therefore, the gas sensors in this experimental example work well even with an applied voltage as low as 10 mV if measures are taken to reduce noise. This contributes to the realization of low-power consumption gas sensors.

[Experimental Example 5]

Figure 8A:
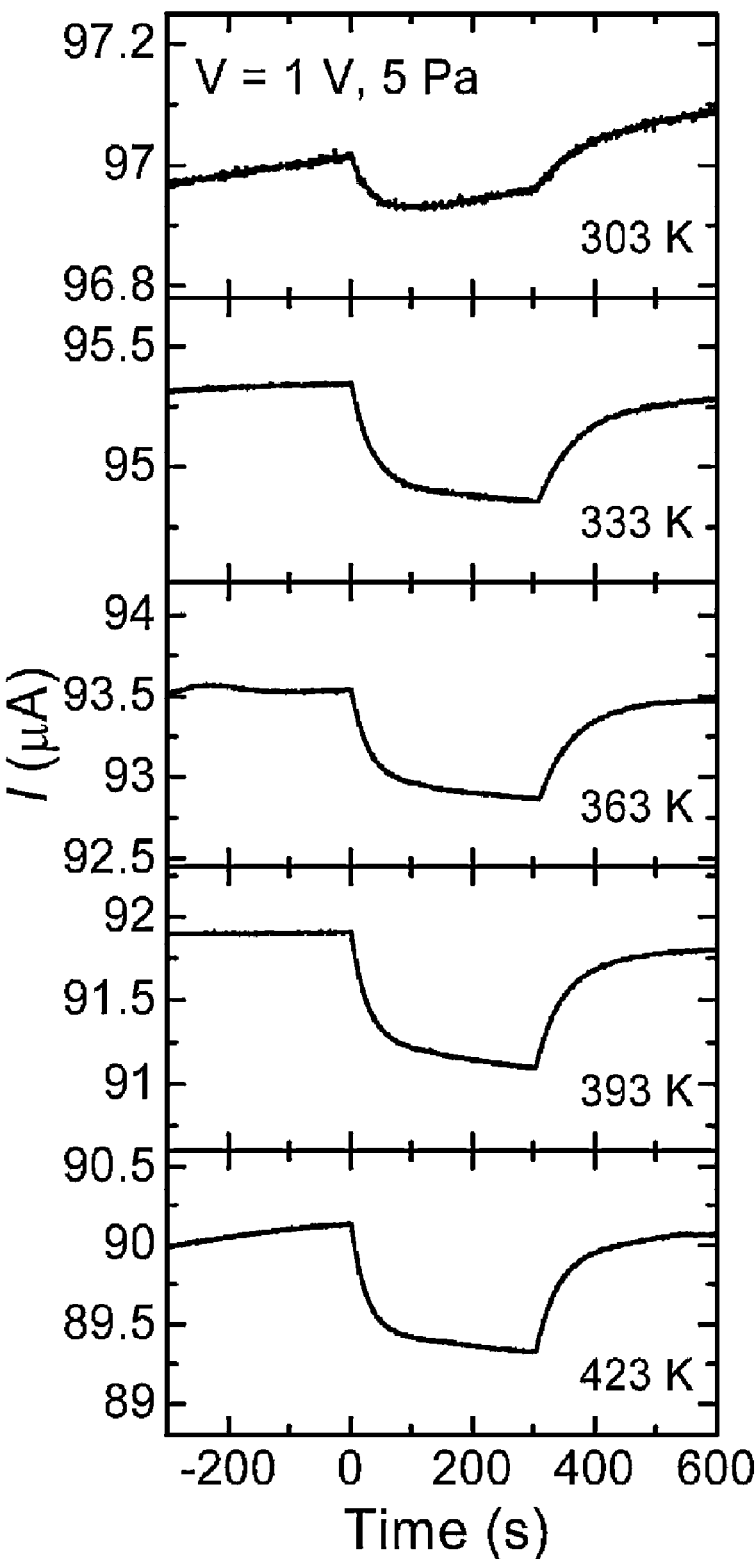
FIG. 8A is a graph illustrating the variation of current I over time in Experimental Example 5.
Figure 8B:
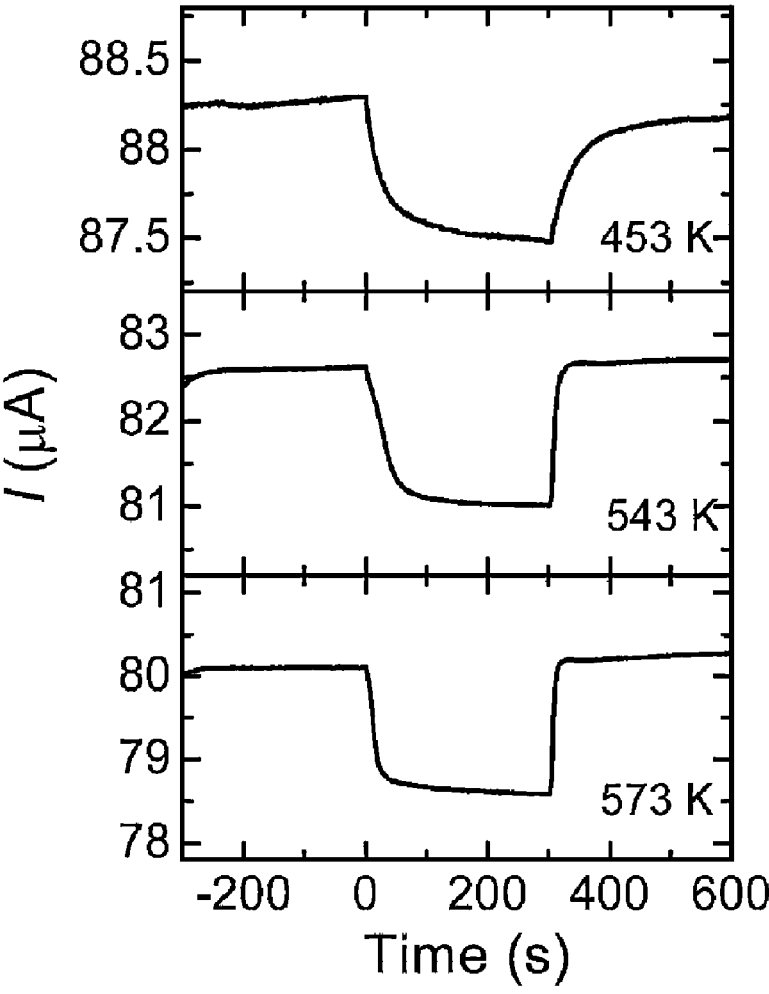
FIG. 8B is a graph illustrating the variation of current I over time in Experimental Example 5.

Gas sensors were fabricated under the same conditions as in Experimental Example 1. Then, oxygen gas detection tests were conducted under the same conditions as in Experimental Example 1 (applied voltage V=1.0 V, oxygen pressure $P_{O2}$=5 Pa) except that the operating temperature T was set at various levels (303 K, 333 K, 363 K, 393 K, 423 K, 453 K, 543 K, and 573 K). The oxygen gas was turned on at 0 seconds and turned off at 300 seconds. The operating temperature T was adjusted by the temperature setting of a micro heater installed on the backside of the substrate. FIGS. 8A and 8B are graphs illustrating the variation of current I over time at each level. The sensor performance at each level is listed in Table 3.

TABLE 3

| Operating temperature (K) | Response time $t_{res}$ (sec) | Recovery time $t_{rec}$ (sec) | Sensitivity S (%) |
| --- | --- | --- | --- |
| 303 | 140 | 140 | 0.5 |
| 333 | 128 | 170 | 0.5 |
| 363 | 140 | 130 | 0.7 |
| 393 | 150 | 130 | 0.8 |
| 423 | 100 | 130 | 0.9 |
| 453 | 120 | 120 | 0.9 |
| 543 | 69 | 21 | 1.9 |
| 573 | 47 | 13 | 1.9 |

As can be seen from Table 3, the higher the operating temperature T, the faster response and higher sensitivity to oxygen gas were achieved. The fact that responses were obtained even at 303 K, where the operating temperature T was almost room temperature, suggests that there is no need to raise the sensor temperature when operating the gas sensor. This demonstrates that the gas sensors according to the present disclosure can achieve low-power consumption drive without heating by a heater.

[Experimental Example 6]

Figure 9:
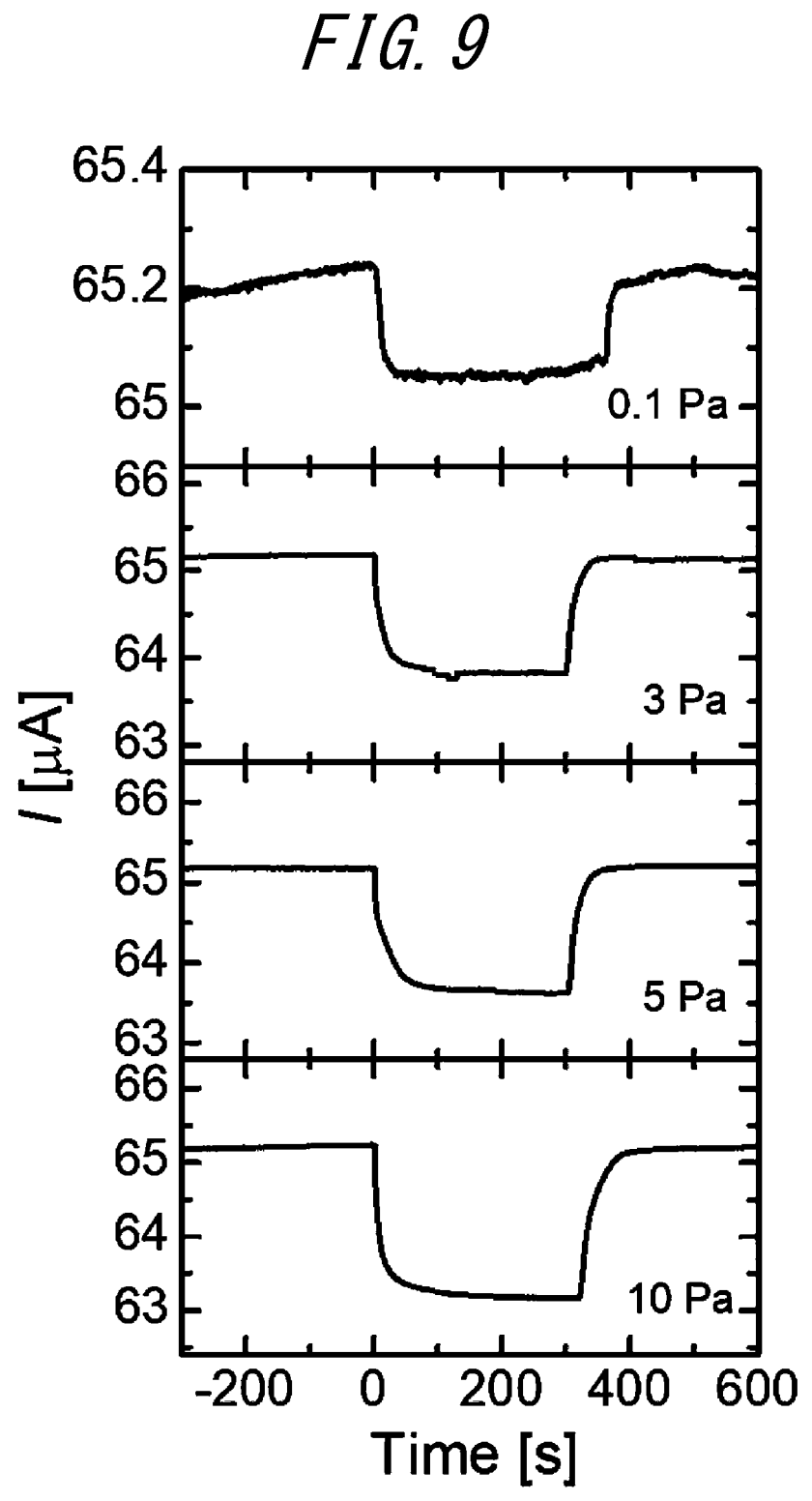

Gas sensors were fabricated under the same conditions as in Experimental Example 1. Then, oxygen gas detection tests were conducted under the same conditions as in Experimental Example 1 (applied voltage V=1.0 V, operating temperature T=300° C. (573 K)), except that the oxygen pressure $P_{O2}$ was set at various levels (10 Pa, 5 Pa, 3 Pa, and 0.1 Pa). The oxygen gas was turned on at 0 seconds and turned off at 300 seconds. FIG. 9 is a graph illustrating the variation of current I over time at each level. The sensor performance at each level is listed in Table 4.

TABLE 4

| Oxygen pressure $P_{O2}$ (Pa) | Response time $t_{res}$ (sec) | Recovery time $t_{rec}$ (sec) | Sensitivity S (%) |
| --- | --- | --- | --- |
| 0.1 | 24 | 33 | 0.3 |
| 3 | 40 | 30 | 2.1 |
| 5 | 52 | 37 | 2.4 |
| 10 | 43 | 50 | 3.2 |

As can be seen from Table 4, the sensitivity S depends on the oxygen pressure; the sensitivity becomes higher as the oxygen pressure increases. On the other hand, the response and recovery times are less dependent on the oxygen pressure. Responses were obtained even at an oxygen pressure of 0.1 Pa, indicating a wide range of detectable oxygen gas concentrations.

[Experimental Example 7]

Figure 10:
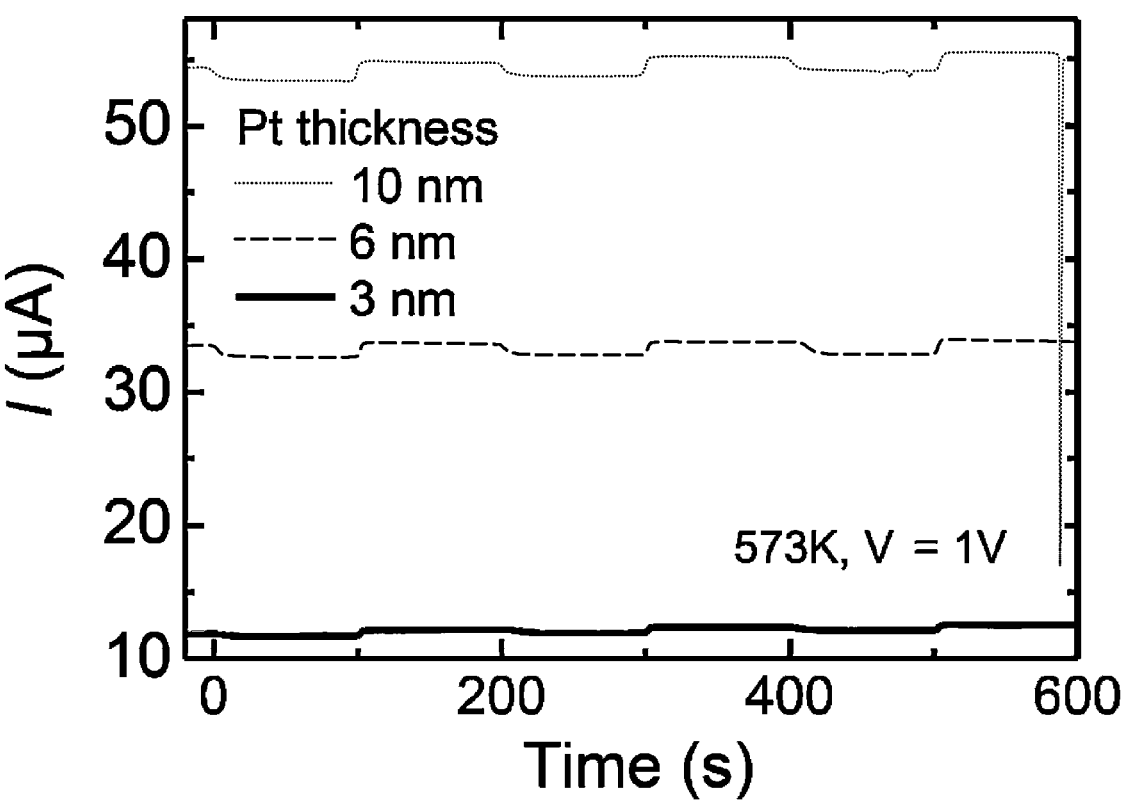
FIG. 10 is a graph illustrating the variation of current I over time in Experimental Example 7.

Gas sensors were fabricated under the same conditions as in Experimental Example 1, except that the thickness of the Pt nanowire was set at three levels, 3 nm, 6 nm, and 10 nm. Then, oxygen gas detection tests were conducted under the same conditions as in Experimental Example 1 (applied voltage V=1.0 V, operating temperature T=300° C. (573 K), and oxygen pressure $P_{O2}$=5 Pa). The oxygen gas was turned on at 0 seconds and switched off/on every 100 seconds thereafter. FIG. 10 is a graph illustrating the variation of current I over time at each level. The sensitivity S calculated from the results in FIG. 10 was 3.8% for a thickness of 3 nm, 2.5% for a thickness of 6 nm, and 3.6% for a thickness of 10 nm. This indicates that the sensitivity S does not depend much on the Pt thickness. However, if the thickness of the Pt nanowire is less than 1 nm, electrical conduction as a Pt nanowire cannot be obtained. Therefore, the thickness is preferably 1 nm or more.

[Experimental Example 8]

Figure 11:
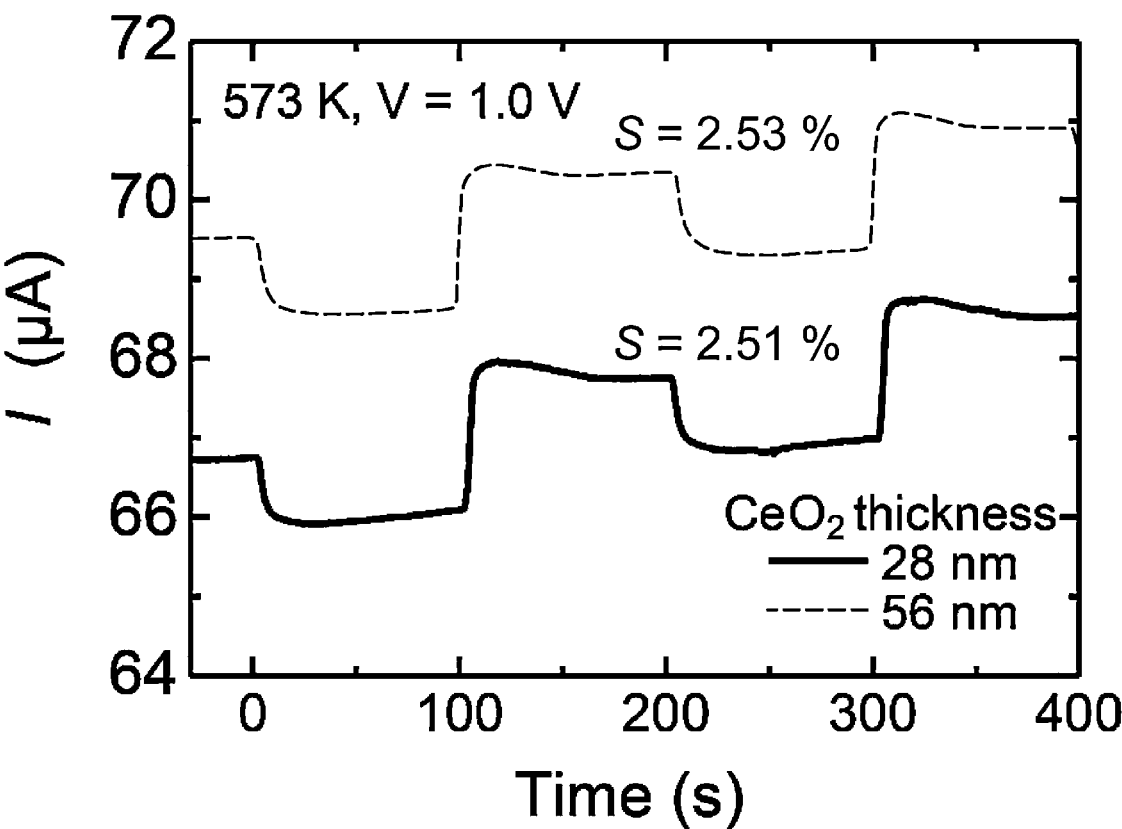
FIG. 11 is a graph illustrating the variation of current I over time in Experimental Example 8.

Gas sensors were fabricated under the same conditions as in Experimental Example 1, except that the thickness of the CeO₂ layer was set at two levels, 28 nm and 56 nm. Then, oxygen gas detection tests were conducted simultaneously under the same conditions as in Experimental Example 1 (applied voltage V=1.0 V, operating temperature T=300° C. (573 K), and oxygen pressure $P_{O2}$=5 Pa). The oxygen gas was turned on at 0 seconds and switched off/on every 100 seconds thereafter. FIG. 11 is a graph illustrating the variation of current I over time at each level. As can be seen from FIG. 11, the response and recovery times are independent of the thickness of the CeO₂ layer. The sensitivity S calculated from the results in FIG. 11 was 2.5% for both levels. This indicates that the sensitivity S is independent of the thickness of the CeO₂ layer.

[Experimental Example 9]

A gas sensor was fabricated under the same conditions as in Experimental Example 1, except that the formation order of the CeO₂ layer and the Pt nanowire was reversed. That is, first, as in Experimental Example 1, a Si substrate with a surface layer made of SiO₂ was prepared. A Pt nanowire was then formed on the SiO₂ layer using an electron beam writer EBL (ELS-7500EX from Elionix Inc.). Specifically, an electron beam resist ZEP-520A was applied on the SiO₂ layer by spin-coating, and then a mask pattern with a predetermined shape was drawn by the EBL. Then, a Ti layer (thickness: 3 nm) and a Pt layer (thickness: 10 nm) on the Ti layer were formed by electron beam evaporation. Then, a Pt nanowire (width W: 8 nm, thickness: 10 nm, length L: 416 nm, cross-sectional shape perpendicular to the nanowire: rectangular) was formed on the SiO₂ layer via a lift-off process to peel off the mask pattern. Note that the Ti layer was formed as an adhesive layer to bond the Pt nanowire on the SiO₂ layer.

Subsequently, a first pad electrode and a second pad electrode (150 μm×150 μm), each being formed from a Ti layer (thickness: 5 nm) and a Pt layer (thickness: 40 nm) on the Ti layer, were fabricated on the SiO₂ layer using a general photolithography method.

Then, the precursor solution was applied by spin-coating at 4,000 rpm to cover the SiO₂ layer, the Pt nanowire, and the first and second pad electrodes on the substrate. Then, heat treatment was performed at 400° C. for 1 hour using a rapid thermal annealer (RTA) to form a cerium oxide (CeO₂) layer (thickness: 28 nm) so as to cover the SiO₂ layer, the Pt nanowire, and the first and second pad electrodes on the substrate. In this case, the Pt nanowire was embedded in the CeO₂ layer. That is, the CeO₂ layer was located on the Pt nanowire and in contact with the top surface of the Pt nanowire. The CeO₂ layer was also in contact with the side surfaces of the Pt nanowire. The CeO₂ layer and the Pt nanowire formed ohmic contacts.

Finally, the CeO₂ layers on the first pad electrode and the second pad electrode were removed by a physical scratching method to enable electrical contacts to be made from the first and second pad electrodes. In this way, a gas sensor combining the CeO₂ layer and the Pt nanowire was fabricated.

Figure 12:
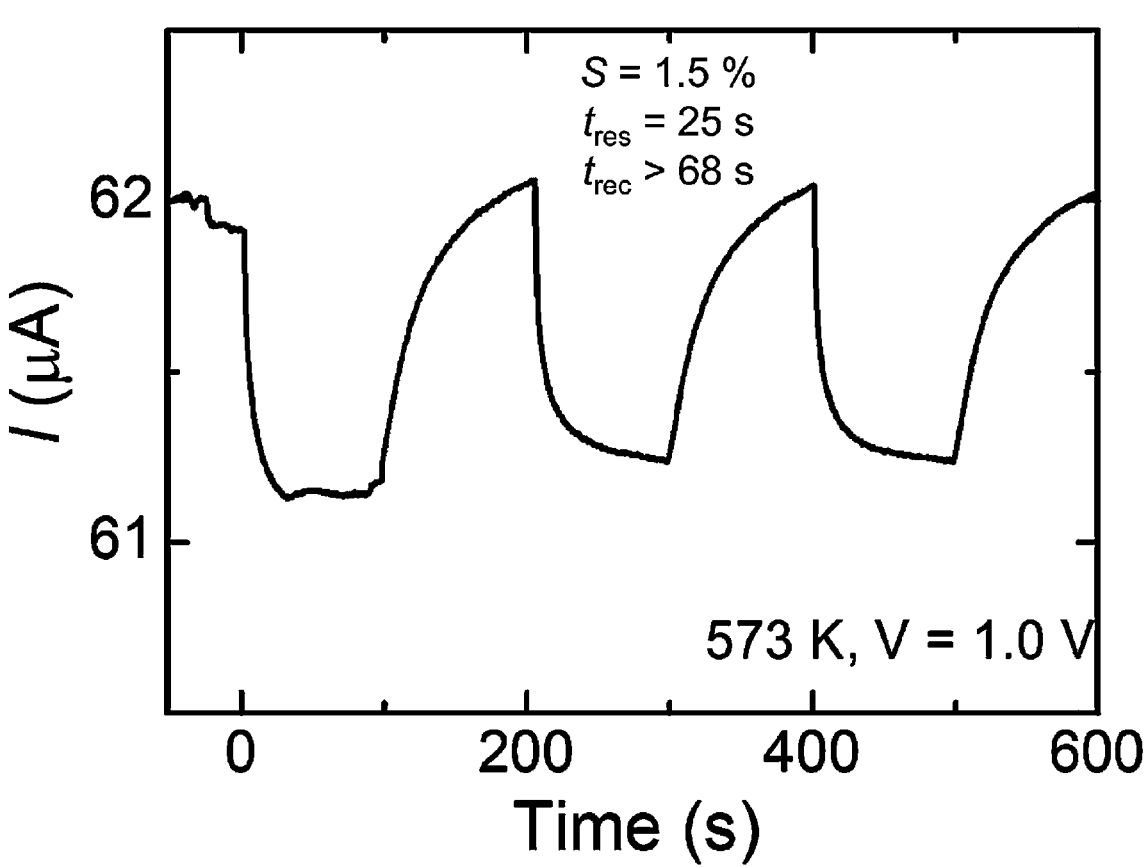
FIG. 12 is a graph illustrating the variation of current I over time in Experimental Example 9.

Then, oxygen gas detection tests were conducted under the same conditions as in Experimental Example 1 (applied voltage V=1.0 V, operating temperature T=300° C. (573 K), and oxygen pressure $P_{O2}$=5 Pa). The oxygen gas was turned on at 0 seconds and switched off/on every 100 seconds thereafter. FIG. 12 is a graph illustrating the variation of current I over time. In this experimental example, the response time $t_{res}$ was 25 seconds and the recovery time $t_{rec}$ was 68 seconds or longer, indicating fast response to oxygen gas. The sensitivity S was 1.5%, indicating high sensitivity to oxygen gas.

[Experimental Example 10]

A gas sensor was fabricated under the same conditions as in Experimental Example 1, except that the oxide layer was a SnO₂ or ZrO₂ layer instead of a CeO₂ layer. Then, oxygen gas detection tests were conducted under the same conditions as in Experimental Example 1 (applied voltage V=1.0 V, operating temperature T=300° C. (573 K), and oxygen pressure $P_{O2}$=5 Pa).

Figures 13A, 13B:
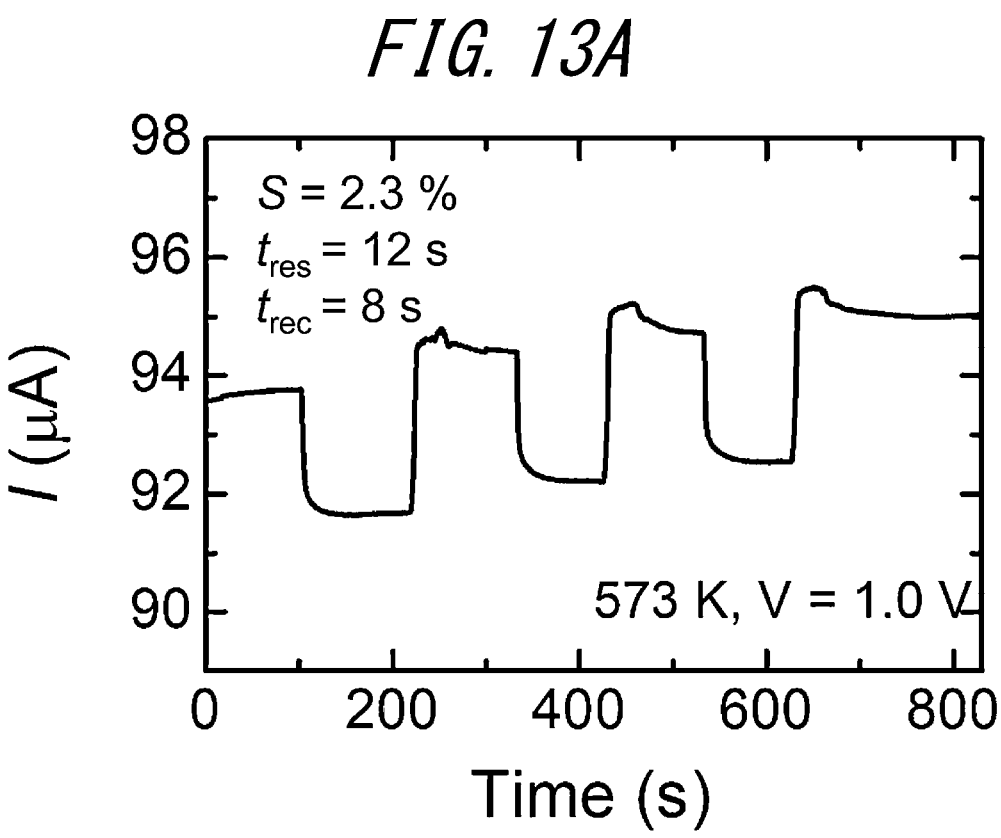
FIGS. 13A and 13B are graphs illustrating the variation of current I over time in Experimental Example 10.

In the case of the $SnO_2$ layer, the oxygen gas was turned on at 100 seconds and switched off/on approximately every 100 seconds. FIG. 13A is a graph illustrating the variation of current I over time. The response time $t_{res}$ was 12 seconds and the recovery time $t_{rec}$ was 8 seconds, indicating fast response to oxygen gas. The sensitivity S was 2.3%, indicating high sensitivity to oxygen gas.

In the case of the $ZrO_2$ layer, the oxygen gas was turned on at 0 seconds and turned off at 600 seconds. FIG. 13B is a graph illustrating the variation of current I over time. The response time tres was 12 seconds, indicating fast response to oxygen gas. However, the recovery time $t_{rec}$ was long, 2 hours or longer. The sensitivity S was 97%, indicating high sensitivity to oxygen gas.

The $SnO_2$ layer was formed by the following procedure. A 0.4 mol/kg tin oxide ($SnO_2$) precursor solution was prepared by dissolving tin(II) acetylacetonate $C_{10}H_{14}O_4Sn$ (in 99.9%, from Sigma-Aldrich) in propionic acid (from Wako Chemical Co., Ltd.). After mixing, the precursor solution was stirred on a hot plate (110° C.) at 1,000 rpm for 30 minutes to make a clear and uniform solution. The solution was then passed through a 0.2-μm PTFE syringe filter and stored at 4° C.

A tin oxide ($SnO_2$) layer (thickness: 30 nm) was formed on the substrate by applying the precursor solution by spin-coating at 3,000 rpm and performing heat treatment at 300° C. for 1 hour using a rapid thermal annealer (RTA). Note that the resistivity of tin oxide ($SnO_2$ ) at 300° C. is 10 Ω·m.

The $ZrO_2$ layer was formed by the following procedure. A zirconium oxide ($ZrO_2$) layer (thickness: 30 nm) was formed on the substrate by sputtering in an Ar atmosphere using a sputter target made of $ZrO_2$. Note that the resistivity of zirconium oxide ($ZrO_2$) at 300° C. is 80,000 Ω·m.

[Experimental Example 11]

Figure 14:
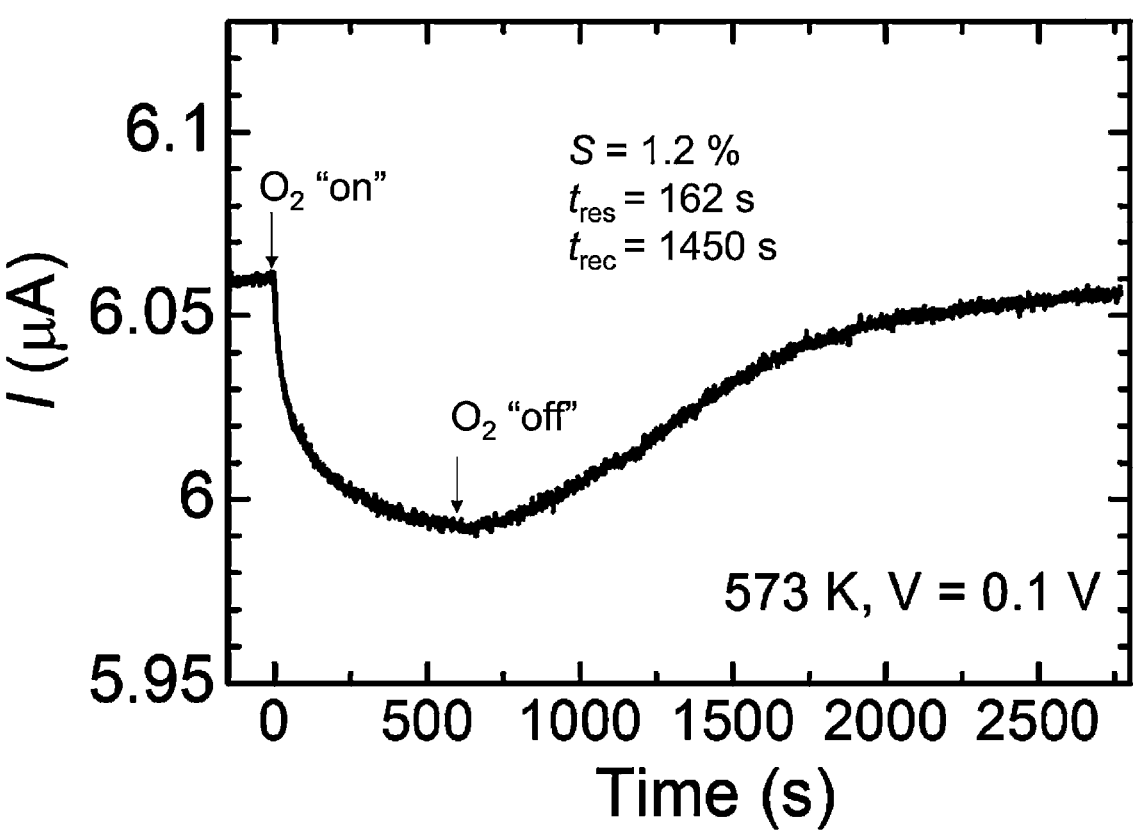
FIG. 14 is a graph illustrating the variation of current I over time in Experimental Example 11.

A gas sensor was fabricated under the same conditions as in Experimental Example 1. Then, oxygen gas detection tests were conducted under the same conditions as in Experimental Example 1 (operating temperature T=300° C. (573 K)), except that the applied voltage $V_d$ was set to 0.1 V and nitrogen gas (flow rate: 1,000 sccm) was flowed as the carrier gas in the measurement chamber. The oxygen gas was turned on at 0 seconds and turned off at 600 seconds. The oxygen gas flow rate was 50 sccm and the oxygen concentration was 5%. FIG. 14 is a graph illustrating the variation of current I over time. This experimental example demonstrates that the oxygen gas can be detected even in the presence of a carrier gas.

INDUSTRIAL APPLICABILITY

The gas sensor according to the present disclosure has fast response and high sensitivity to oxygen gas, and may be applicable to a variety of sensors such as oxygen sensors for internal combustion engines and breath sensors.

REFERENCE SIGNS LIST

100 Gas sensor
10 Substrate
12A First pad electrode
12B Second pad electrode

14 Nanowire
16 Oxide layer
18 Power source
20 Ammeter
35 22 Voltmeter
30 Resist film
32 Mask pattern
34 Metal film
34A First portion of metal film
34B Second portion of metal film

The invention claimed is:

1. A gas sensor comprising:
a substrate having an insulating surface;
a first pad electrode and a second pad electrode each formed on or above the insulating surface of the substrate;
a nanowire connecting the first pad electrode and the second pad electrode and formed on or above the insulating surface of the substrate, the nanowire consisting of at least one selected from the group consisting of platinum (Pt), palladium (Pd), rhodium (Rh), ruthenium (Ru), osmium (Os), iridium (Ir), and alloys thereof; and
an oxide layer in contact with the nanowire, the oxide layer being made of a high-resistance semiconductor that is an oxide of a metal different from a metal constituting the nanowire and at least satisfying one or both of the following conditions: (I) being located between the insulating surface of the substrate and the nanowire and in contact with a bottom surface of the nanowire, and (II) being located on the nanowire and in contact with a top surface of the nanowire,
wherein oxygen gas is detected based on changes in electrical signals detected across the first pad electrode and the second pad electrode with a current flowing across the first pad electrode and the second pad electrode, and
wherein a first conduction path where carriers pass through the nanowire and a second conduction path where carriers are injected from the nanowire into the oxide layer, travel through the oxide layer, and return to the nanowire are created when the oxygen gas is detected.

2. The gas sensor according to claim 1, wherein the nanowire has a width of 5 nm or more and 150 nm or less.

3. The gas sensor according to claim 1, wherein the nanowire has a thickness of 1 nm or more and 20 nm or less.

4. The gas sensor according to claim 1, wherein the nanowire has a length of 80 nm or more.

5. The gas sensor according to claim 1, wherein the high-resistance semiconductor constituting the oxide layer is at least one selected from the group consisting of cerium oxide, tin oxide, zirconium oxide, zinc oxide, tungsten oxide, iron oxide, nickel oxide, cerium-zirconium oxide, titanium oxide, cobalt oxide, niobium oxide, tantalum oxide, rhodium oxide, and hafnium oxide.

6. The gas sensor according to claim 1, wherein the oxide layer has a thickness of 5 nm or more.

7. The gas sensor according to claim 1, wherein the nanowire and the oxide layer are in ohmic contact with each other.

8. The gas sensor according to claim 1, wherein the substrate is a glass substrate, an alumina substrate, a zirconia substrate, or a silicon substrate with a silicon oxide film formed on a surface thereof.

9. The gas sensor according to claim 1, wherein the first pad electrode and the second pad electrode are made of the same type of metal as the nanowire.

10. A gas sensor comprising:

a substrate having an insulating surface;

a first pad electrode and a second pad electrode each formed on or above the insulating surface of the substrate;

a nanowire connecting the first pad electrode and the second pad electrode and formed on or above the insulating surface of the substrate, the nanowire consisting of at least one selected from the group consisting of platinum (Pt) and alloys thereof; and an oxide layer in contact with the nanowire, the oxide layer being made of a high-resistance semiconductor that is an oxide of a metal different from a metal constituting the nanowire and at least satisfying one or both of the following conditions: (I) being located between the insulating surface of the substrate and the nanowire and in contact with a bottom surface of the nanowire, and (II) being located on the nanowire and in contact with a top surface of the nanowire, wherein the high-resistance semiconductor constituting the oxide layer is at least one selected from the group consisting of cerium oxide, tin oxide, and zirconium oxide, and wherein gas is detected based on changes in electrical signals detected across the first pad electrode and the second pad electrode with a current flowing across the first pad electrode and the second pad electrode.

\* \* \* \* \*